United States Patent
Oishi et al.

(10) Patent No.: US 9,614,440 B2
(45) Date of Patent: Apr. 4, 2017

(54) POWER SUPPLY DEVICE AND SEMICONDUCTOR INTEGRATED CIRCUIT DEVICE

(71) Applicant: FUJITSU LIMITED, Kawasaki-shi, Kanagawa (JP)

(72) Inventors: Kazuaki Oishi, Yokohama (JP); Eiji Yoshida, Yokohama (JP); Yasufumi Sakai, Fuchu (JP)

(73) Assignee: FUJITSU LIMITED, Kawasaki (JP)

( * ) Notice: Subject to any disclaimer, the term of this patent is extended or adjusted under 35 U.S.C. 154(b) by 518 days.

(21) Appl. No.: 14/082,589

(22) Filed: Nov. 18, 2013

(65) Prior Publication Data

US 2014/0285164 A1   Sep. 25, 2014

(30) Foreign Application Priority Data

Mar. 22, 2013  (JP) ................................ 2013-060550

(51) Int. Cl.
| | |
|---|---|
| H02M 3/158 | (2006.01) |
| H02M 3/156 | (2006.01) |
| G05F 1/46 | (2006.01) |
| H03F 1/02 | (2006.01) |
| H02M 1/00 | (2006.01) |

(52) U.S. Cl.
CPC ............ *H02M 3/1563* (2013.01); *G05F 1/46* (2013.01); *H03F 1/0222* (2013.01); *H02M 3/1584* (2013.01); *H02M 2001/0045* (2013.01)

(58) Field of Classification Search
None
See application file for complete search history.

(56) References Cited

U.S. PATENT DOCUMENTS

| 5,905,407 A | 5/1999 | Midya | |
|---|---|---|---|
| 6,300,826 B1* | 10/2001 | Mathe | H03F 1/0222 330/10 |

(Continued)

FOREIGN PATENT DOCUMENTS

| CN | 1443395 | 9/2003 |
|---|---|---|
| CN | 102629854 | 8/2012 |

(Continued)

OTHER PUBLICATIONS

Wang et al., "Design of Wide-Bandwidth Envelope-Tracking Power Amplifiers for OFDM Applications," IEEE Transactions on Microwave Theory and Techniques, vol. 53, No. 4, Apr. 2005, pp. 1244-1255.

Wang et al., "An Improved Power-Added Efficiency 19-dBm Hybrid Envelope Elimination and Restoration Power Amplifier for 802.11g WLAN Applications," IEEE Transactions on Microwave Theory and Techniques, vol. 54, No. 12, Dec. 2006, pp. 4086-4099.

(Continued)

*Primary Examiner* — Timothy J Dole
*Assistant Examiner* — Monica Mata
(74) *Attorney, Agent, or Firm* — Fujitsu Patent Center

(57) ABSTRACT

A power supply device includes a linear regulator including an output stage amplifier, a current sensing circuit, and a switching regulator. The current sensing circuit detects an output current of the linear regulator, and is disposed in parallel with the output stage amplifier, in a configuration corresponding to the output stage amplifier. The switching regulator operates in accordance with an output signal of the current sensing circuit. The linear regulator and the switching regulator operate in collaboration with each other to generate an output voltage at an output node.

21 Claims, 18 Drawing Sheets

(56) References Cited

U.S. PATENT DOCUMENTS

| | | | |
|---|---|---|---|
| 6,661,210 B2* | 12/2003 | Kimball | H02M 3/1584 323/268 |
| 7,365,661 B2* | 4/2008 | Thomas | H02M 3/157 341/117 |
| 8,233,860 B2 | 7/2012 | Lee | |
| 2002/0008574 A1 | 1/2002 | Mathe et al. | |
| 2004/0266366 A1 | 12/2004 | Robinson et al. | |
| 2008/0094043 A1 | 4/2008 | Inomoto | |
| 2008/0104432 A1 | 5/2008 | Vinayak et al. | |
| 2008/0272750 A1* | 11/2008 | Aitto-Oja | H02M 3/1584 323/266 |
| 2009/0184764 A1* | 7/2009 | Markowski | H03F 1/0227 330/136 |
| 2009/0191826 A1* | 7/2009 | Takinami | H03F 1/0227 455/110 |
| 2010/0039836 A1* | 2/2010 | Gong | H02M 3/156 363/21.13 |
| 2012/0126893 A1 | 5/2012 | Yamanouchi et al. | |
| 2012/0154035 A1 | 6/2012 | Hongo et al. | |
| 2012/0194274 A1 | 8/2012 | Fowers et al. | |
| 2012/0235738 A1 | 9/2012 | Masuda et al. | |
| 2012/0286752 A1* | 11/2012 | Tsukiji | H02M 3/156 323/282 |
| 2012/0313701 A1 | 12/2012 | Khlat et al. | |

FOREIGN PATENT DOCUMENTS

| | | |
|---|---|---|
| JP | 2005-20696 | 1/2005 |
| JP | 2008-529456 | 7/2008 |
| JP | 2010-508577 | 3/2010 |
| JP | 2012-134705 | 7/2012 |
| JP | 2012-199648 | 10/2012 |
| WO | 2011-013420 A1 | 2/2011 |

OTHER PUBLICATIONS

CNOA—Office Action of Chinese Patent Application for Invention No. 201410042066.7 dated Dec. 30, 2015. English Translation of the Office Action.

Choi et al.,"A Polar Transmitter With CMOS Programmable Hysteretic-Controlled Hybrid Switching Supply Modulator for Multistandard Applications," IEEE Transactions Microwave Theory and Techniques, vol. 57, No. 7, pp. 1675-1686, Jul. 2009.

CNOA—Office Action of Chinese Patent Application No. 201410042066.7 dated Jul. 14, 2016, with partial translation of the Office Action.

JPOA—Office Action of Japanese Patent Application No. 2013-060550 mailed Sep. 13, 2016, with partial English translation of the Office Action.

* cited by examiner

POWER SUPPLY DEVICE AND SEMICONDUCTOR INTEGRATED CIRCUIT DEVICE

CROSS-REFERENCE TO RELATED APPLICATION

This application is based upon and claims the benefit of priority of the prior Japanese Patent Application No. 2013-060550, filed on Mar. 22, 2013, the entire contents of which are incorporated herein by reference.

FIELD

The embodiments discussed herein are related to a power supply device, and a semiconductor integrated circuit device.

BACKGROUND

In recent years, battery-driven mobile terminals having a communication function such as smart phones, tablets (computers), and the like, need to be communicated by reducing the consumption of wasteful power. Therefore, in some cases, a drain modulation system such as Envelope Tracking (ET), polar modulation, Envelope Elimination and Restoration (EER), and the like is adopted as a power amplifier (PA) which is one of the blocks having a largest power consumption in a mobile terminal.

As such power supply device of an EER system and an ET system employing a drain modulation system, for example, a hybrid-type power supply device in which a linear regulator and a switching regulator operate in collaboration with each other is used.

In other words, such power supply device is used as a power supply of a power amplifier for high frequency signals such as a transmitter. A power voltage of the amplifier is increased or decreased in response to a change of an envelope component drawn by a peak value of an input signal to reduce wasteful power and enhance efficiency.

As described above, a hybrid-type power supply device in which a linear regulator and a switching regulator operate in collaboration with each other has been put into practice, and such power supply device commonly employs a current detecting resistance for a circuit monitoring an output current of the linear regulator.

In other words, since the hybrid-type power supply device commonly detects the output current of the linear regulator by using the current detecting resistance, a power consumption resulting from the current detecting resistance causes degradation in power efficiency of the power supply device or the power amplifier.

In this regard, various types of hybrid-type power supply devices in which a linear regulator and a switching regulator operate in collaboration with each other have been proposed.
Patent Document 1: Japanese National Publication of International Patent Application No. 2010-508577
Patent Document 2: Japanese Laid-open Patent Publication No. 2012-134705
Non-Patent Document 1: Feipeng Wang, et al., "Design of wide-bandwidth envelope-tracking power amplifiers for OFDM applications," IEEE Microwave Theory and Techniques Society, pp. 1244-1255, April 2005
Non-Patent Document 2: Feipeng Wang, et al., "An Improved Power-Added Efficiency 19-dBm Hybrid Envelope Elimination and Restoration Power Amplifier for 802.11g WLAN Applications," IEEE Microwave Theory and Techniques Society, pp. 4086-4099, December 2006

SUMMARY

According to an aspect of the embodiments, there is provided a power supply device includes a linear regulator including an output stage amplifier, a current sensing circuit, and a switching regulator.

The current sensing circuit detects an output current of the linear regulator, and is disposed in parallel with the output stage amplifier, in a configuration corresponding to the output stage amplifier. The switching regulator operates in accordance with an output signal of the current sensing circuit. The linear regulator and the switching regulator operate in collaboration with each other to generate an output voltage at an output node.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Before describing embodiments of a power supply device and a semiconductor integrated circuit device in detail, examples of the power supply device and the semiconductor integrated circuit device and their problems will be described with reference to FIG. 1 to FIG. 4.

Figure 1:
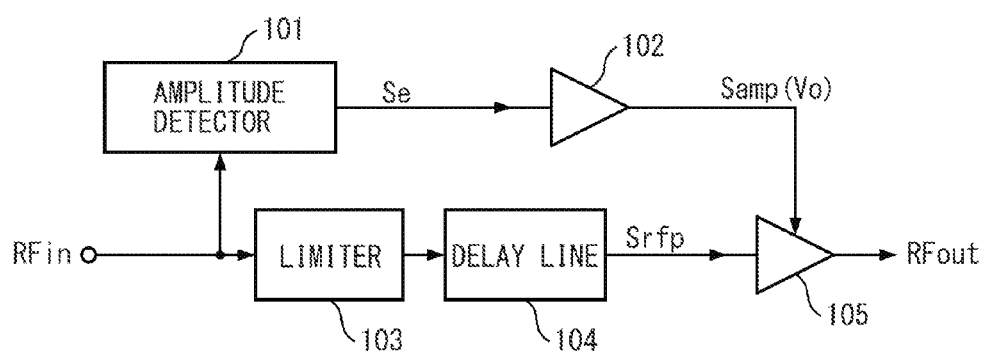
FIG. 1 is a block diagram illustrating one example of an EER system.
Figure 2:
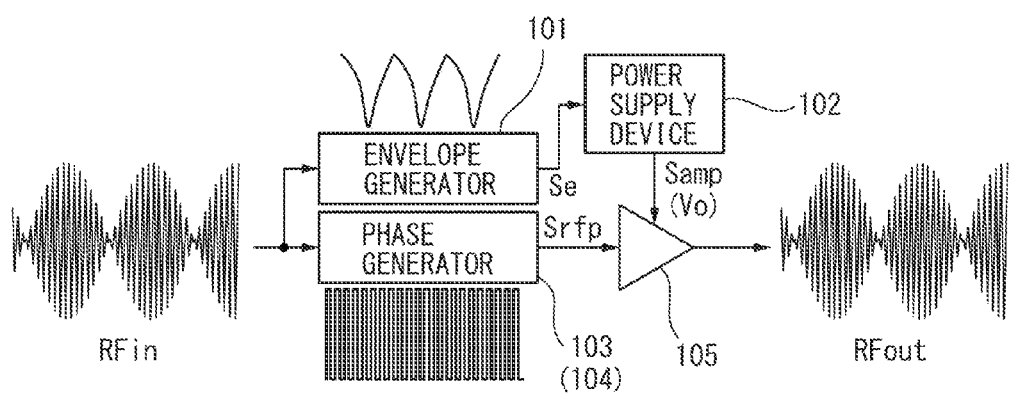
FIG. 2 is a view for describing an operation of the EER system illustrated in FIG. 1.

FIG. 1 is a block diagram illustrating one example of an EER system and FIG. 2 is a view for describing an operation of the EER system illustrated in FIG. 1.

As illustrated in FIG. 1, the EER system is able to be formed, for example, as a single semiconductor integrated circuit device (LSI) and includes an amplitude detector 101, an amplitude amplifier 102, a limiter 103, a delay line 104, and a switch mode power amplifier 105.

As is apparent from a comparison of FIG. 1 and FIG. 2, the amplitude detector 101, the amplitude amplifier 102, and the limiter 103 (the delay line 104) correspond to an envelope generator, a power supply device, and a phase generator, respectively.

A high frequency input signal RFin is thrown off in the limiter 103 and then delayed in the delay line 104. Thereby, the high frequency input signal RFin is converted into a high frequency phase signal Srfp indicating a phase component which is then input as an input signal of the switch mode power amplifier 105.

Further, as for the signal RFin, envelope thereof is detected by the amplitude detector (envelope generator) 101 and thereafter the resulting envelope signal Se is amplified in the amplitude amplifier (power supply device) 102 to generate an amplitude signal Samp (output voltage Vo) indicating an envelope component. This amplitude signal Samp (output voltage Vo) is applied to a power supply input of the switch mode power amplifier 105.

Herein, as a frequency of the high frequency input signal RFin, for example, a frequency of several hundred MHz to several GHz may be used but not limited thereto. Further, the switch mode power amplifier 105 is, for example, an amplifier of class D, class E, or the like.

In this manner, phase information (Srfp) of the high frequency input signal RFin is input to the input of the switch mode power amplifier 105 and at the same time, amplitude information (Samp, Vo) of the signal RFin is input to the power supply of the switch mode power amplifier 105. Thereby, a power-amplified high frequency output signal RFout is output from an output of the amplifier 105.

Figure 3:
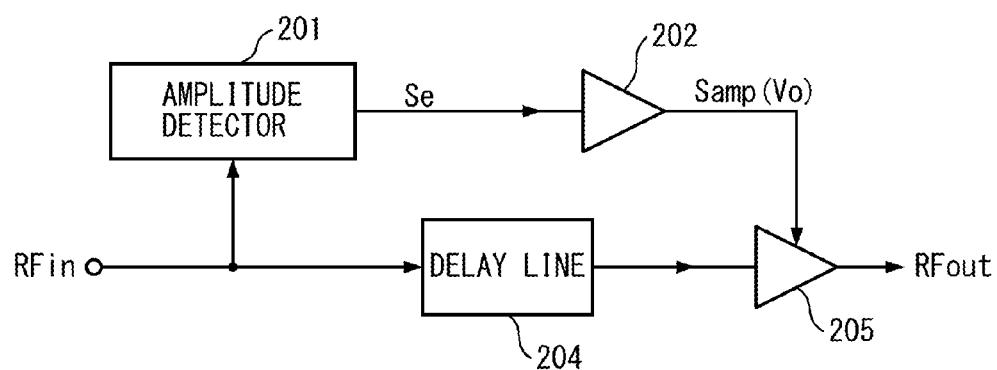
FIG. 3 is a block diagram illustrating one example of an ET system.

FIG. 3 is a block diagram illustrating one example of an ET system. As illustrated in FIG. 3, the ET system is able to be formed, for example, as a single semiconductor integrated circuit device and includes an amplitude detector 201, an amplitude amplifier 202, a delay line 204, and a linear mode power amplifier 205.

As is apparent from a comparison of FIG. 3 and FIG. 1, the ET system does not use the limiter 103 in the EER system, and the high frequency input signal RFin is delayed in the delay line 204 and then input as an input signal of the linear mode power amplifier 205.

Further, as for the signal RFin, envelope thereof is detected by the amplitude detector 201 and thereafter the resulting envelope signal Se is amplified in the amplitude amplifier (power supply device) 202 and applied to a power supply input of the linear mode power amplifier 205 as an amplitude signal Samp (output voltage Vo) indicating an envelope component. Herein, the linear mode power amplifier 205 is, for example, an amplifier of class A, class AB, class B, or the like.

In this manner, the signal RFin is input to the input of the linear mode power amplifier 205 via the delay line 204 and also the power supply voltage (Vo) is allowed to be variable in response to an envelope of an output. Thereby, a power-amplified high frequency signal RFout is output from an output of the amplifier 205.

In a transmitter for wireless communications, for example, a power amplifier is used to transmit radio waves in the air. Since the power amplifier outputs large power signals, the power amplifier is a block having large power consumption in the transmitter.

Therefore, to reduce power consumption of the transmitter, for example, it is preferable to reduce consumption of power by increasing power efficiency of the power amplifier. In other words, in battery-driven mobile terminals having a communication function such as smart phones and tablets, it is preferable to reduce power consumption of the power amplifier.

The power amplifier is roughly categorized into the switch mode power amplifier 105 described with reference to FIG. 1 and FIG. 2 and the linear mode power amplifier 205 described with reference to FIG. 3.

The switch mode power amplifier 105 is capable of amplifying only phase information due to a switching operation of a transistor and therefore another circuit is provided to amplify amplitude information. For example, in an EER system, an input signal RFin is divided into phase information (Srfp) and amplitude information (Samp) and then the switch mode power amplifier 105 is driven by the phase information. Then, the amplitude information is amplified by modulating the power supply.

Further, since the linear mode power amplifier 205 outputs an input signal RFin via linear amplification and is capable of amplifying phase information and amplitude information at the same time, a simple circuit configuration is employable.

The switch mode power amplifier 105 ideally exhibits high power efficiency compared to the linear mode power amplifier 205. This means that ideally, no drain current flows while a voltage is applied to the drain of a transistor (322) in the switch mode power amplifier 105 and conversely, no drain voltage is applied while drain current flows. This comes from the following relationship: power consumption=drain voltage×drain current=0.

As described above, in the EER system, amplitude information (Samp) is expressed by modulating the power supply, but since the power supply device (102) has finite frequency characteristics, distorted amplitude information is transmitted to the amplifier 105, resulting in distortion in the amplifier.

To reduce the distortion in the amplifier, a higher-speed power supply device is needed. As the power supply device, a hybrid-type power supply device that is operable at high speed and in which a linear regulator and a switching regulator operate in collaboration with each other is frequently used.

Figure 4:
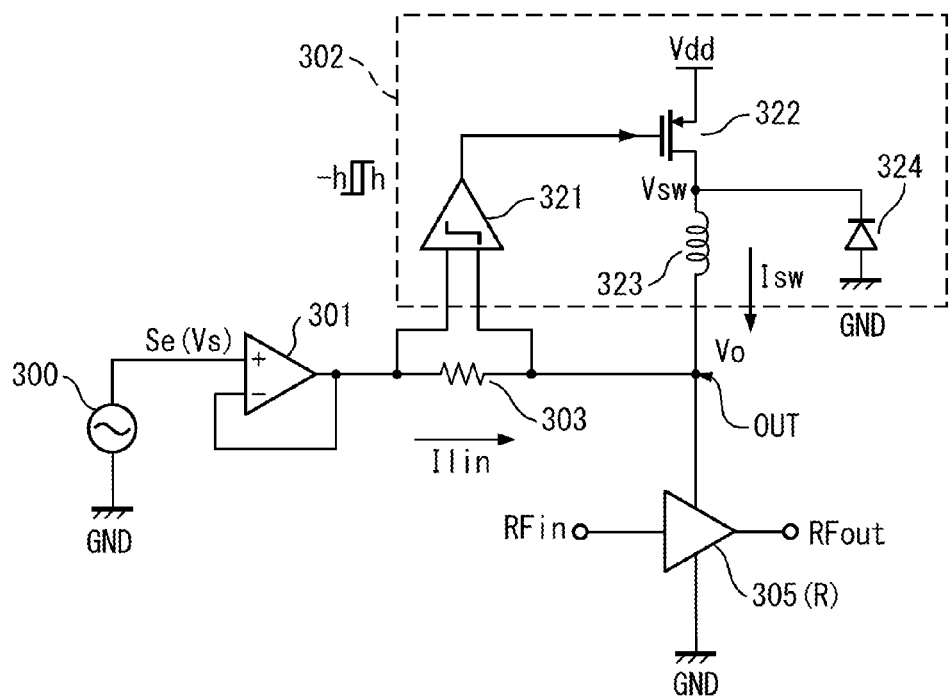
FIG. 4 is a circuit diagram illustrating one example of a hybrid-type power supply device.

FIG. 4 is a circuit diagram illustrating one example of a hybrid-type power supply device (high-speed power supply device), which is applicable to the aforementioned EER system and ET system.

In FIG. 4, reference signs 300, 301, and 302 represent an envelope generator, a linear regulator, and a switching regulator, respectively, and reference signs 303 and 305 represent a current detecting resistance and a high frequency power amplifier (RF power amplifier), respectively.

Herein, the envelope generator 300 corresponds to, for example, the amplitude detector 101 in FIG. 1 and outputs an envelope signal Se (Vs) to the linear regulator 301. An output of the linear regulator 301 is applied to the power amplifier 305 as an output voltage Vo from an output node OUT via the current detecting resistance 303.

The switching regulator 302 includes a hysteresis comparator 321, a transistor (switching device, switch) 322, a coil (inductor) 323, and a diode 324. An input of the hysteresis comparator 321 is provided with the current detecting resistance 303, and the current detecting resistance 303 detects a direction of current Ilin flowing from the linear regulator 301 to the output node OUT to control the switch 322.

In other words, an output signal of the hysteresis comparator 321 controls switching of the switch (P-channel-type MOS transistor) 322.

The source of the transistor 322 is connected to a power supply line applied with a power supply voltage Vdd, and the gate thereof receives an output signal of the hysteresis comparator 321. From the drain, a switching voltage Vsw is extracted. Herein, reference sign Isw represents switching current flowing in the coil 323.

Further, the drain of the transistor 322 is connected to the cathode of the diode 324 whose anode is connected to the ground (GND) and one end of the coil. The other end of the coil 323 is connected to a power supply input of the power amplifier 305 and applied with an output voltage Vo.

In other words, the current detecting resistance 303 detects an output current Ilin of the linear regulator 301 and then in accordance with the detected result, the switching regulator 302 controls switching of the transistor 322 to output a predetermined voltage.

Therefore, the output of the switching regulator 302 is connected to the output of the linear regulator 301 at the output node OUT via the coil 323. The output voltage Vo is generated at the output node OUT and then applied as a power supply voltage of the power amplifier 305.

As described above, a high-speed power supply device, in other words, a hybrid-type power supply device in which a linear regulator and a switching regulator operate in collaboration with each other includes the current detecting resistance 303 detecting the output current Ilin of the linear regulator 301.

Since the current detecting resistance 303 generates a voltage capable of operating the hysteresis comparator 321 by the output current Ilin of the linear regulator 301, power consumption resulting from the current detecting resistance 303 occurs. This consumption of power due to the current detecting resistance 303 causes degradation in power efficiency of the power supply device or the entire EER system.

In addition, since a voltage drop occurs from providing the current detecting resistance 303, in the output node OUT, an output voltage of the linear regulator 301 is decreased.

Thereby, in addition, an output voltage range of the power supply device becomes narrower.

Figure 5:
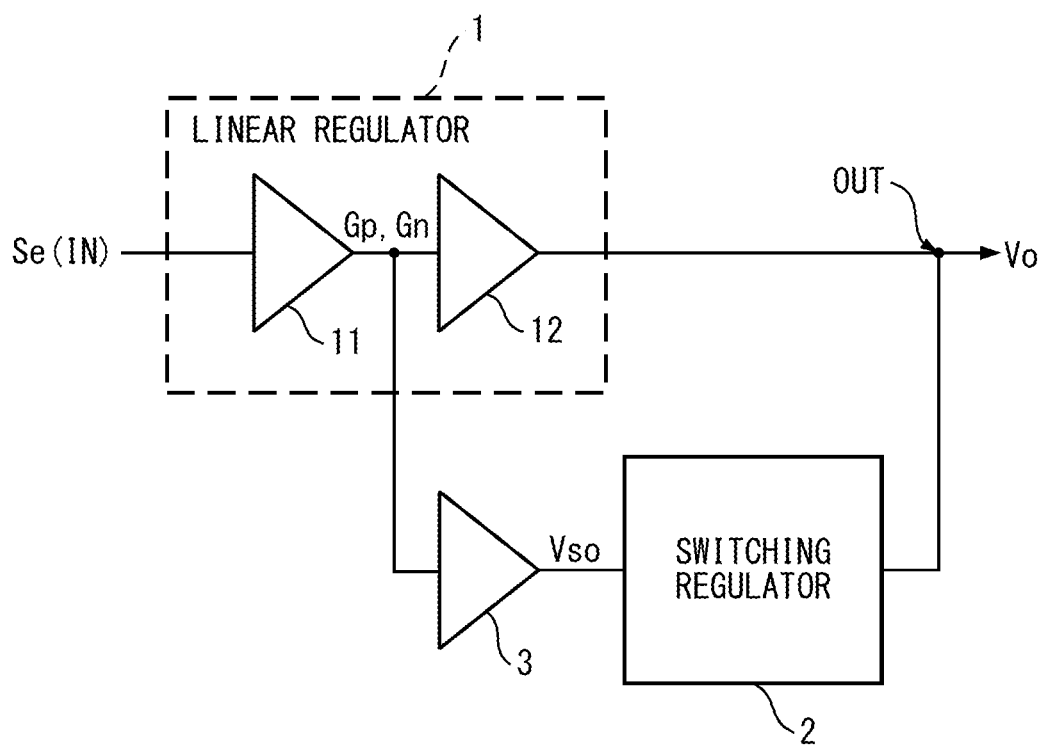
FIG. 5 is a block diagram illustrating a power supply device of a first embodiment.

The power supply device and the semiconductor integrated circuit device of the present embodiment will now be described in detail with reference to the accompanying drawings. FIG. 5 is a block diagram illustrating a power supply device of a first embodiment. As illustrated in FIG. 5, the power supply device of the first embodiment includes a linear regulator 1, a switching regulator 2, and a current sensing circuit 3.

The linear regulator 1 includes a front stage amplifier 11 and an output stage amplifier 12. The current sensing circuit 3 receives an output signal of the front stage amplifier 11 and then detects an output current of the linear regulator 1.

In other words, the current sensing amplifier 3 has a configuration corresponding to the output stage amplifier 12 and is controlled by the same signals as signals for controlling the output stage amplifier 12 (output signals Gp and Gn of the front stage amplifier 11).

An output signal (output voltage Vso) of the current sensing circuit 3 is input to the switching regulator 2 and then an output of the linear regulator 1 and an output of the switching regulator 2 are connected together at an output node OUT to generate an output voltage Vo.

The power supply device of the first embodiment does not include, for example, the current detecting resistance 303 described with reference to FIG. 4 and therefore, no power resulting from the current detecting resistance 303 is consumed.

Figure 6:
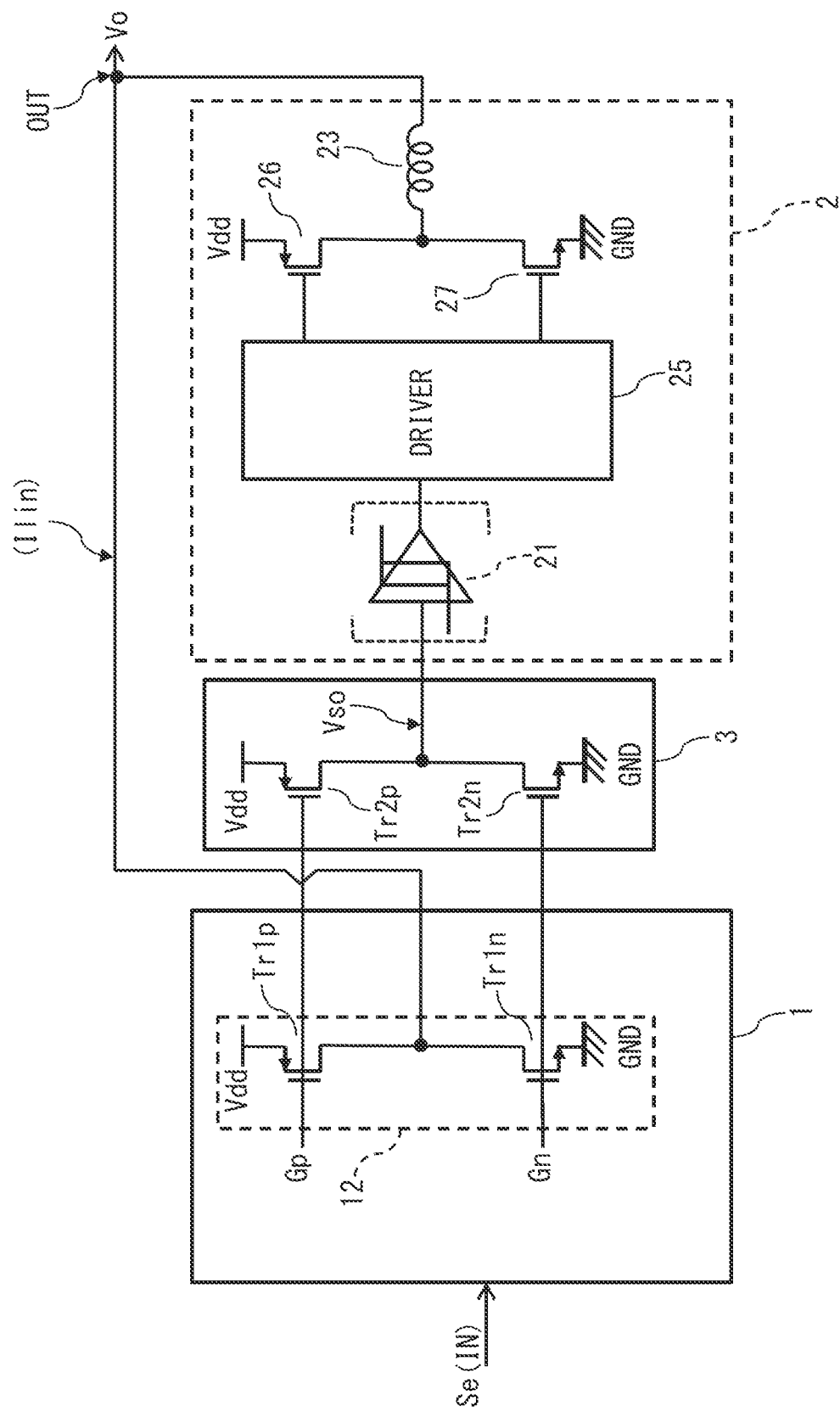
FIG. 6 is a circuit diagram illustrating one example of the power supply device illustrated in FIG. 5.

FIG. 6 is a circuit diagram illustrating one example of the power supply device illustrated in FIG. 5. In FIG. 6, reference signs Tr1p and Tr2p each represent a p-channel-type MOS transistor (pMOS transistor) and reference signs Tr1n and Tr2n each represent an n-channel-type MOS transistor (nMOS transistor). Further, reference sign Vdd represents a power supply line applied with a power supply potential and reference sign GND represents a power supply line (grounding line) applied with a grounding potential.

As illustrated in FIG. 6, the output stage amplifier 12 and the current sensing circuit 3 each have a push-pull configuration. The output stage amplifier 12 includes a pMOS (first) transistor Tr1P that is connected to the power supply line Vdd and generates source current and an nMOS (second) transistor Tr1n that is connected to the grounding line GND and generates sink current.

In the same manner, the current sensing circuit 3 includes a pMOS (third) transistor Tr2P that is connected to the power supply line Vdd and generates source current and an nMOS (fourth) transistor Tr2n that is connected to the grounding line GND and generates sink current.

An output signal (a first control signal) Gp of the front stage amplifier 11 is input to the gates of the transistors Tr1p and Tr2p, and an output signal (a second control signal) Gn of the front stage amplifier 11 is input to the gates of the transistors Tr1n and Tr2n.

Here, when a transconductance of a transistor is designated as Gm, a (first) current generating ability ratio concerning Tr1p and Tr1n in the output stage amplifier 12 (Gm[Tr1p]:Gm[Tr1n]) is allowed to be substantially the same as a (second) current generating ability ratio in the current sensing circuit 3 (Gm[Tr2p]:Gm[Tr2n]).

Thereby, the current sensing circuit 3 has a function as a replica of the output stage amplifier 12. The expression of Gm[Tr1p] represents a transconductance (current drive ability) of the transistor Tr1p, and the other expressions represent the corresponding ones.

Further, the sizes of the transistors Tr1p and Tr1n of the output stage amplifier 12 are set to be larger than those of the transistors Tr2p and Tr2n of the current sensing circuit 3. In other words, since the current sensing circuit 3 merely detects a current (Ilin) of an output signal of the linear regulator 1, a power consumption resulting from the current sensing circuit 3 is able to be further reduced by having the smaller-sized transistors than in the output stage amplifier 12.

The switching regulator 2 includes a pMOS (sixth) transistor 26 and an nMOS (seventh) transistor 27 connected in series between a power supply line Vdd and a grounding line GND and a driver 25 controlling these transistors 26 and 27. Note that it is possible for a hysteresis buffer 21 to be disposed in a front stage of the driver 25.

In other words, an output signal (output voltage Vso) of the current sensing circuit 3 is input to the driver 25 via the hysteresis buffer 21. The hysteresis buffer 21 prevents, for example, a malfunction of the switching regulator 2 due to noise of a high frequency component.

Next, operations of the current sensing circuit 3 and the switching regulator 2 will be described. In FIG. 6, in the case where current is discharged from the output stage amplifier 12, a control signal Gp from the front stage amplifier (11) is controlled at a level so as to further increase a current of the transistor Tr1p, and a control signal Gn therefrom is controlled at a level so as to further decrease a current of the transistor Tr1n.

At that time, in the current sensing circuit 3, the transistor Tr2p has a large current and becomes close to an ON state, and the transistor Tr2n has a small current and becomes close to an OFF state. As a result, an output signal (Vso) of the current sensing circuit 3 comes to a high level "H".

The switching regulator 2 receives an output signal of the high level "H" from the current sensing circuit 3 and operates in a direction where current is discharged from the switching regulator 2, in other words, so as to switch on the transistor 26 and to switch off the transistor 27. Therefore, current flows from the power supply line Vdd to the output node OUT via the transistor 26 and a coil 23.

Conversely, in the case where current is absorbed into the output stage amplifier 12, the control signal Gp is controlled at a level so as to further decrease a current of the transistor Tr1p, and the control signal Gn is controlled at a level so as to further increase a current of the transistor Tr1n.

At that time, in the current sensing circuit 3, the transistor Tr2p has a small current and becomes close to an OFF state, and the transistor Tr2n has a large current and becomes close to an ON state. As a result, an output signal of the current sensing circuit 3 comes to a low level "L".

The switching regulator 2 receives an output signal of the low level "L" from the current sensing circuit 3 and operates in a direction where current is absorbed into the switching regulator 2, in other words, so as to switch off the transistor 26 and to switch on the transistor 27. Therefore, current flows from the output node OUT to the grounding line GND via the coil 23 and the transistor 27.

Here, in the power supply device illustrated in FIG. 4, current (an output current Ilin of the linear regulator 301) flows in the current detecting resistance 303 to consume power, resulting in degradation in power efficiency.

Further, as described above, since a voltage drop occurs from providing the current detecting resistance 303 and thereby an output voltage of the linear regulator 301 decreases at the output node OUT, an output voltage range of the power supply device also becomes narrower, resulting in degradation in power efficiency.

In contrast, according to the power supply device of the first embodiment, currents output from the linear regulator 1 and the switching regulator 2 are added to become an output voltage Vo. In other words, the outputs from the linear regulator 1 and the switching regulator 2 are directly connected to each other, which make a resistance (the current detecting resistance 303 in FIG. 4) not to lie therebetween. Therefore, it is possible to prevent degradation in power efficiency and a decrease in the output voltage range.

Figure 7A:
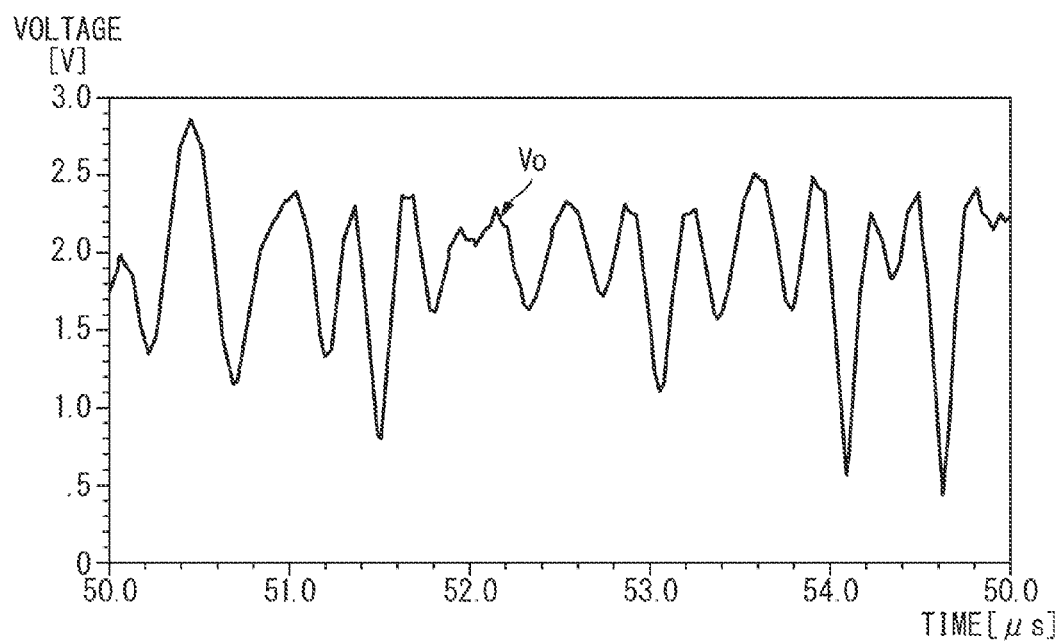
FIG. 7A and FIG. 7B are charts for describing an operation of the power supply device illustrated in FIG. 6.
Figure 7B:
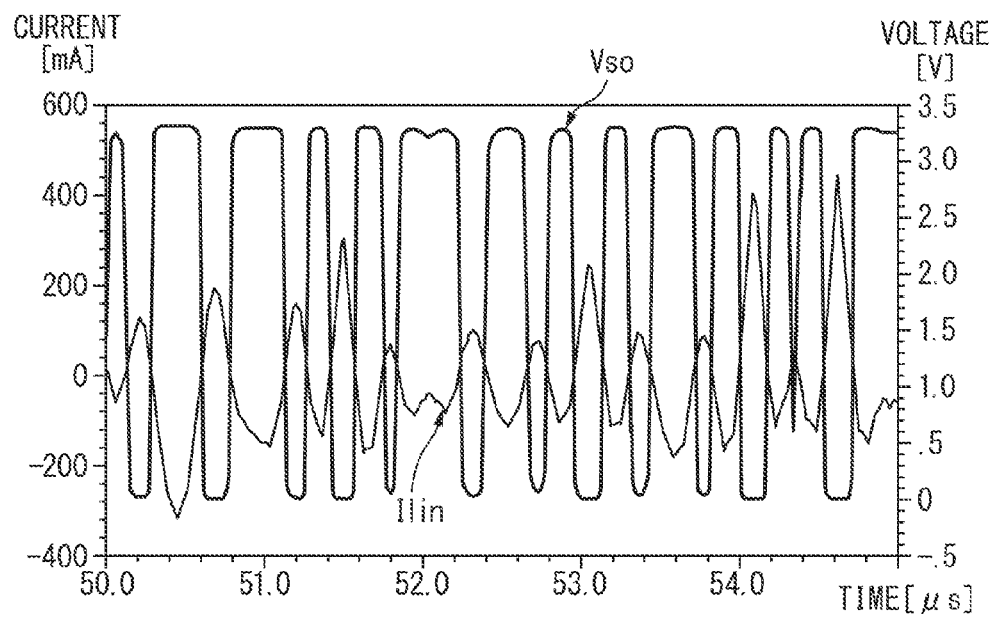

FIG. 7A and FIG. 7B are charts for describing an operation of the power supply device illustrated in FIG. 6. FIG. 7A illustrates a simulation waveform of an output voltage Vo of the power supply device, and FIG. 7B illustrates simulation waveforms of the output current Ilin of the linear regulator 1 and the output voltage Vso of the current sensing circuit 3. Herein, in FIG. 7B, the output current Ilin of the linear regulator 1 and the output voltage Vso of the current sensing circuit 3 are indicated by referring to the left-side scale and the right-side scale, respectively.

As illustrated in FIG. 7A, it is understood that the output voltage Vo of the power supply device has an output waveform quickly responding to an input envelope signal (Se).

In addition, as illustrated in FIG. 7B, it is understood that levels ("H" and "L") of the output voltage Vso of the current sensing resistance 3 change in accordance with changes in polarity of the output current Ilin of the linear regulator 1 and therefore a correct operation is performed.

Figure 8:
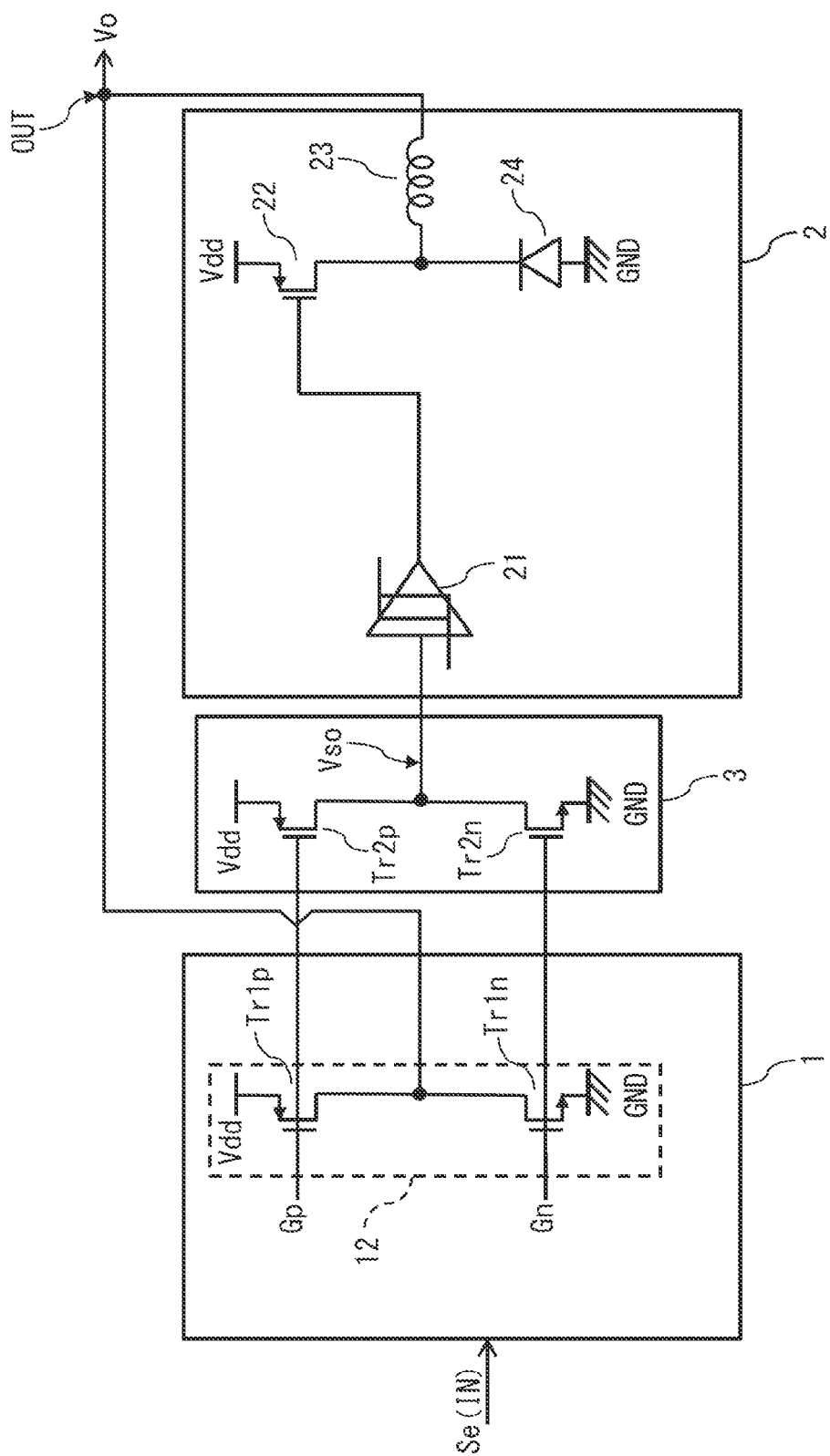
FIG. 8 is a circuit diagram illustrating another example of the power supply device illustrated in FIG. 5.

FIG. 8 is a circuit diagram illustrating another example of the power supply device illustrated in FIG. 5 and corresponds to the one where the switching regulator 202, indicated in aforementioned FIG. 4, is adopted as the switching regulator 2.

As illustrated in FIG. 8, an output (output voltage Vso) of the current sensing circuit 3 is input to the hysteresis buffer 21 and a pMOS (fifth) transistor (switch) 22 is switch-controlled by an output of the hysteresis buffer 21.

Note that it is possible, for example, to remove the hysteresis buffer 21 and to directly input an output signal of the current sensing circuit 3 to the gate of the transistor 22, if there is no possibility of a malfunction of the switching regulator 2 due to such as noise of a high frequency component.

As is apparent from a comparison of FIG. 8 and aforementioned FIG. 4, the transistor 22, the coil (inductor) 23, and the diode 24 in FIG. 8 correspond to the transistor 322, the coil 323, and the diode 324 in FIG. 4, respectively.

In other words, an output of the switching regulator 2 is connected, via the coil 23, to an output of the linear regulator 1 at an output node OUT. At the output node OUT, an output voltage Vo is generated to be applied, for example, as a power supply voltage of the power amplifier.

It will be understood without saying that the switching regulators 2 illustrated in FIG. 6 and FIG. 8 are merely examples and switching regulators having various other configurations are adoptable. In addition, the linear regulator 1 is not limited to, for example, the one including the front stage amplifier 11 and the output stage amplifier 12 illustrated in FIG. 5, and the configuration of the output stage amplifier 12 is not either limited to the ones of FIG. 6 and FIG. 8.

In this manner, the power supply device according to the present embodiment does not use resistance for the current sensor. Accordingly, it is possible to prevent degradation in power efficiency and a decrease in the output voltage range.

Figure 9:
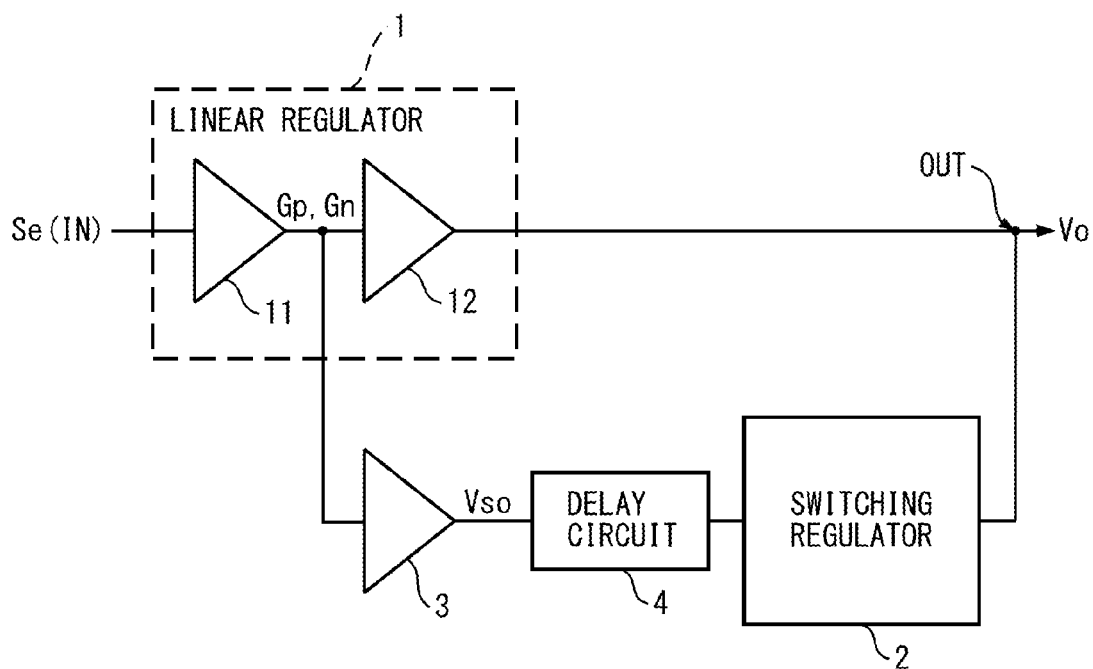
FIG. 9 is a block diagram illustrating a power supply device of a second embodiment.
Figure 10A:
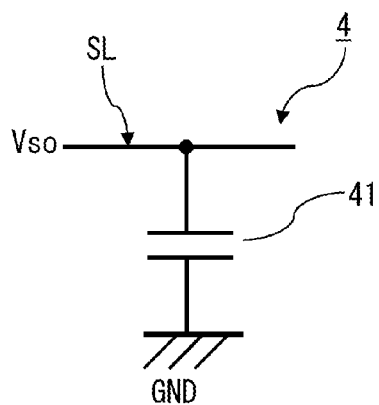
FIG. 10A, FIG. 10B, FIG. 10C, and FIG. 10D are circuit diagrams illustrating examples of a delay circuit in the power supply device illustrated in FIG. 9.
Figure 10B:
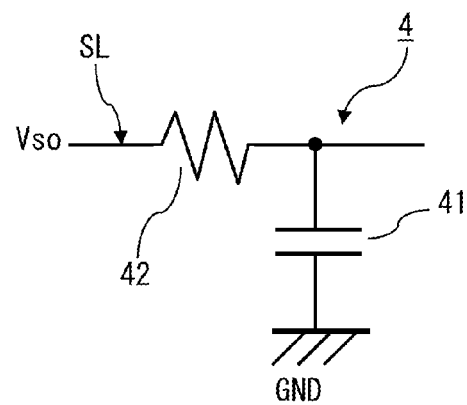

FIG. 9 is a block diagram illustrating a power supply device of a second embodiment. FIG. 10A, FIG. 10B, FIG.

Figure 10C:
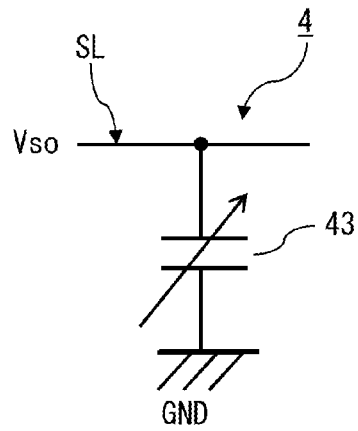
Figure 10D:
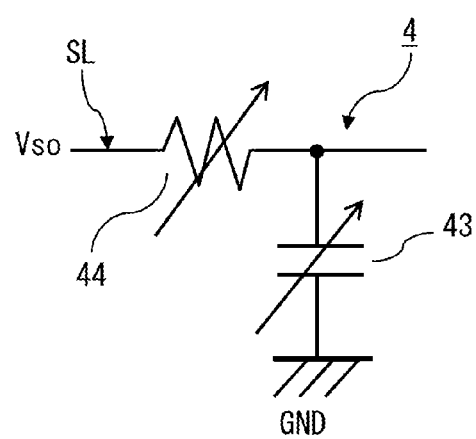

10C, and FIG. 10D are circuit diagrams illustrating examples of a delay circuit in the power supply device illustrated in FIG. 9. Herein, FIG. 10A to FIG. 10D each illustrate an example of a delay circuit 4.

As is apparent from a comparison of FIG. 9 and aforementioned FIG. 5, the power supply device of the second embodiment includes the delay circuit 4 between the current sensing circuit 3 and the switching regulator 2.

In other words, when the delay circuit 4 is disposed in an output stage of the current sensing circuit 3, it is possible to inhibit the switching regulator 2 from responding to a high frequency component (noise component) which is unnecessary. When the switching regulator 2 responds to the noise component, power efficiency degrades due to, for example, an unnecessary increase in switching frequency.

In the delay circuit 4 illustrated in FIG. 10A, a fixed capacitor 41 is disposed between a signal line SL where an output (Vso) of the current sensing circuit 3 is input and a grounding line GND. In the delay circuit 4 illustrated in FIG. 10B, one terminal of a fixed resistance 42 is connected to the signal line SL and the other terminal of the resistance 42 is connected to the grounding line GND via a fixed capacitor 41 and also to an input of a back stage switching regulator 2.

In this manner, by adopting a fixed capacitor as the delay circuit 4, it is possible to obtain an amount of delay which is relevant to a current drive ability (transconductance Gm) and a capacitance value of the current sensing circuit 3, for example. Further, by adopting a fixed capacitor and resistance, it is also possible to form a low-frequency pass filter (low-pass filter) having fixed characteristics.

The delay circuit 4 illustrated in FIG. 10C corresponds to the one where the fixed capacitor 41 illustrated in FIG. 10A is replaced by a variable capacitor 43. The delay circuit 4 illustrated in FIG. 10D corresponds to the one where the fixed capacitor 41 illustrated in FIG. 10B is replaced by a variable capacitor 43 and the fixed resistance 42 is replaced by a variable resistance 44.

In this manner, by adopting the variable capacitor as the delay circuit 4, it is possible to provide an optimum amount of delay. In addition, by adopting the variable capacitor and resistance, it is also possible to optimally adjust characteristics of the low-pass filter.

Herein, it will be understood without saying that FIG. 10A to FIG. 10D merely illustrate examples of the delay circuit 4 and the delay circuit 4 having various other configurations are adoptable.

Figure 11:
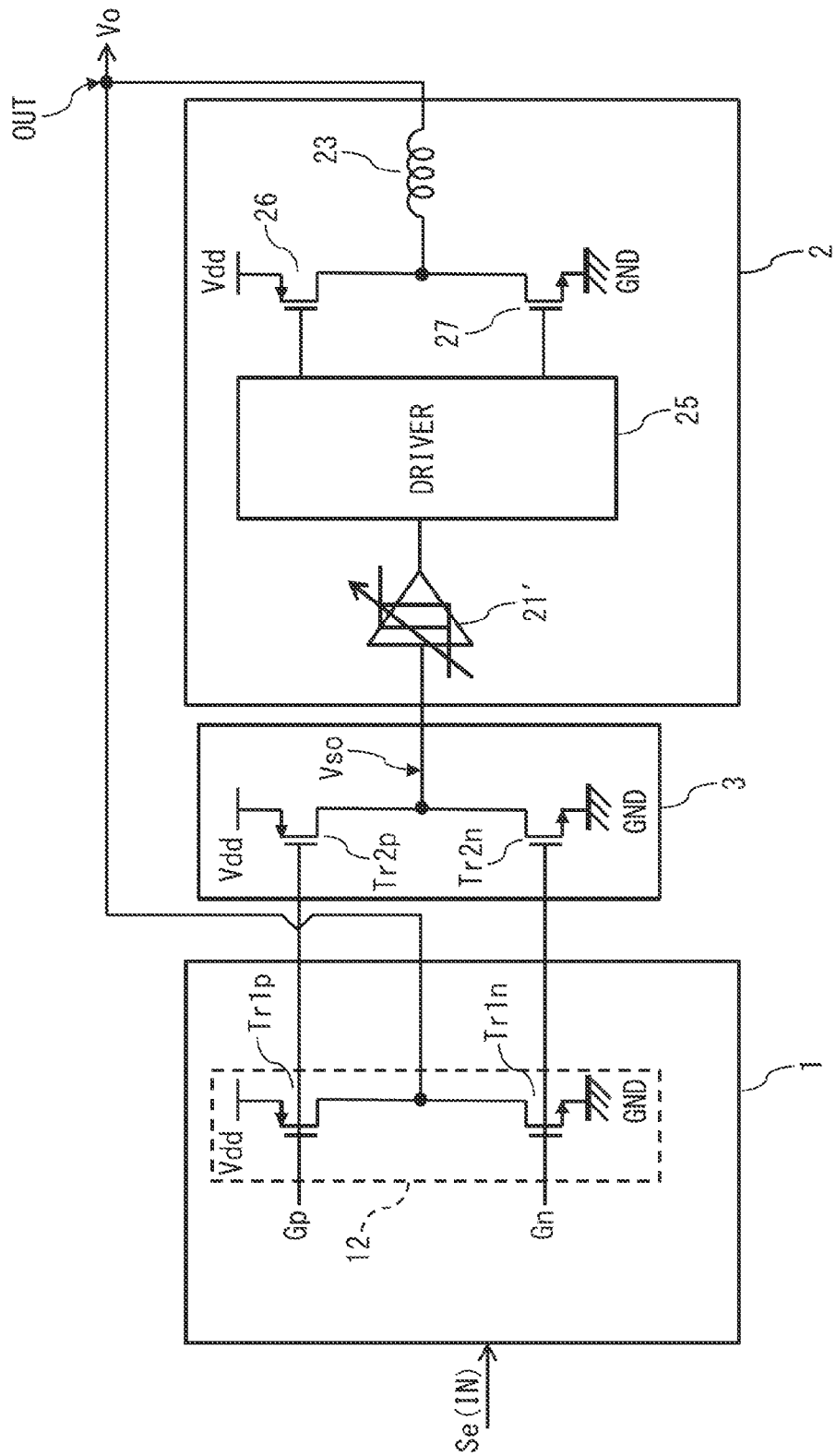
FIG. 11 is a circuit diagram illustrating one example of a power supply device of a third embodiment.
Figure 12:
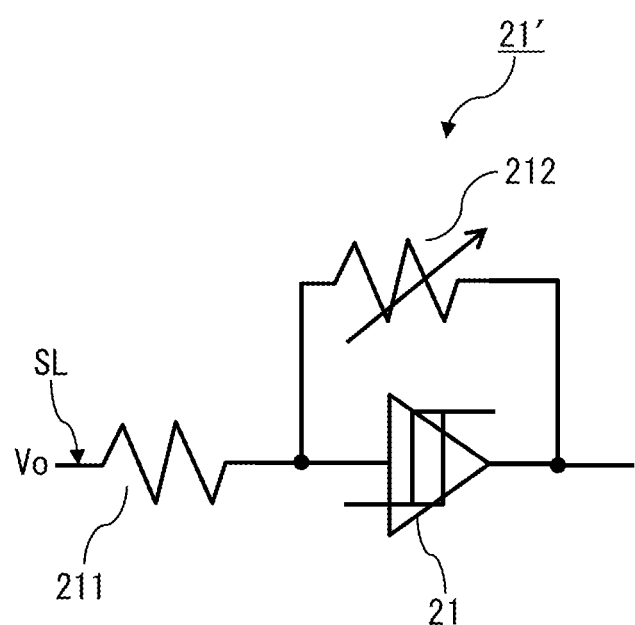
FIG. 12 is a circuit diagram illustrating one example of a hysteresis buffer in the power supply device illustrated in FIG. 11.

FIG. 11 is a circuit diagram illustrating one example of a power supply device of a third embodiment. FIG. 12 is a circuit diagram illustrating one example of a hysteresis buffer in the power supply device illustrated in FIG. 11.

As is apparent from a comparison of FIG. 11 and aforementioned FIG. 6, the power supply device of the third embodiment includes a hysteresis buffer 21' having variable hysteresis characteristics in a front stage of a driver 25 (between the current sensing circuit 3 and the driver 25).

Here, in the hysteresis buffer 21', as illustrated in FIG. 12, a signal line SL where an output (Vso) of the current sensing circuit 3 is input is connected to the hysteresis buffer 21 via a resistance 211, for example.

In addition, a variable resistance 212 is connected between an input and output of the hysteresis buffer 21, and thereby, hysteresis characteristics become adjustable by controlling a resistance value of the variable resistance 212. Therefore, it becomes possible to further inhibit the switching regulator 2 from responding to an unnecessary high frequency component.

Figure 13A:
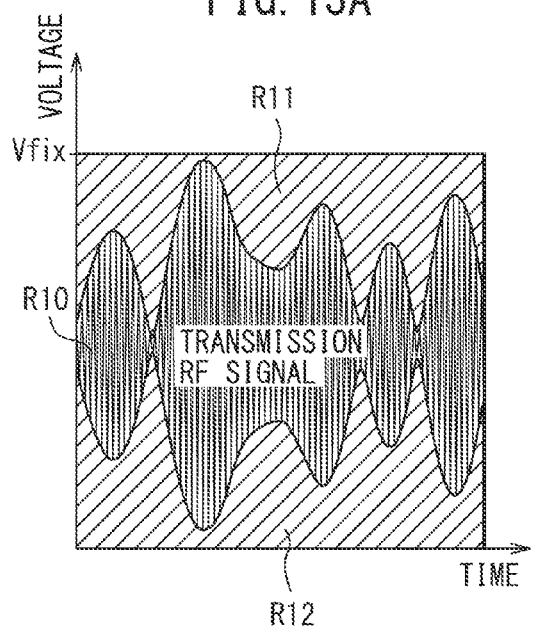
FIG. 13A, FIG. 13B, FIG. 13C, and FIG. 13D are diagrams illustrating, in comparison, power consumptions of a power amplifier according to a fixed power supply voltage and a waveform follow-up power supply voltage in the ET system illustrated in FIG. 3.
Figure 13B:
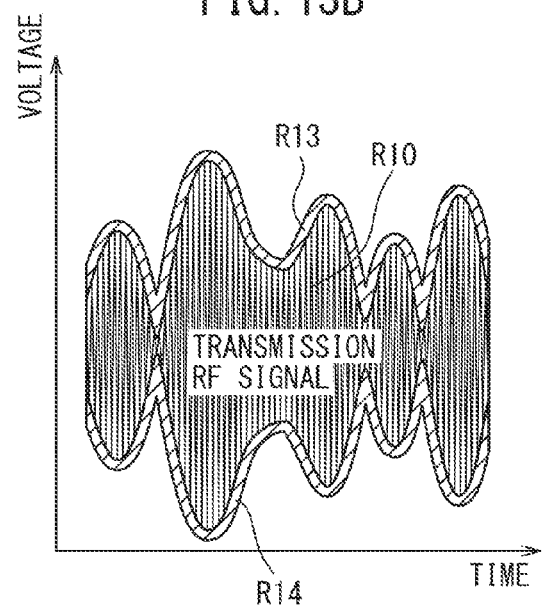
Figure 13C:
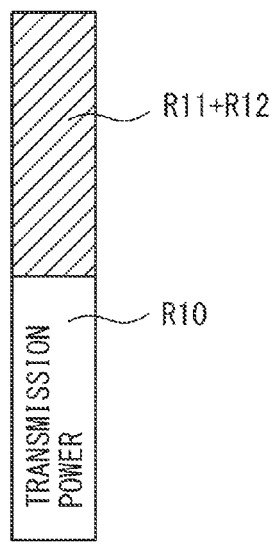
Figure 13D:
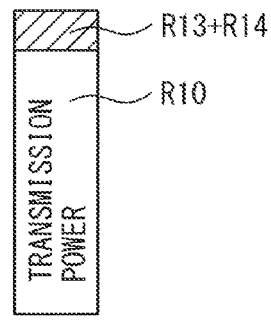

FIG. 13A, FIG. 13B, FIG. 13C, and FIG. 13D are diagrams illustrating, in comparison, power consumption of a power amplifier according to a fixed power supply voltage and a waveform follow-up power supply voltage in the ET system illustrated in FIG. 3. FIG. 13A and FIG. 13C illustrate power consumption of the power amplifier at the time of applying a fixed power supply voltage, and 13B and FIG. 13D illustrate power consumption of the power amplifier at the time of applying a waveform follow-up power supply voltage.

Herein, in FIG. 13A to FIG. 13D, reference sign R10 represents a region of transmission power used as a transmission RF signal and reference signs R11 to R14 represent regions becoming wasteful power (wasted power).

Initially, as illustrated in FIG. 13A, in the case where the power amplifier is driven by applying a fixed power supply voltage, the power supply voltage is fixed at a voltage Vfix that is capable of supplying sufficient power even when the transmission RF signal is maximized (at a maximum level).

Therefore, the regions R11 and R12 in FIG. 13A become wasted power regions, and as illustrated in FIG. 13C where a bar chart is formed therewith, power efficiency is decreased due to the wasted power regions R11 and R12.

On the other hand, in the case where the power amplifier is driven by adopting the aforementioned drain modulation system of ET, the power amplifier is applied with a waveform follow-up power supply voltage following an envelope signal (Se) of a high frequency input signal (RFin). In other words, as illustrated in FIG. 13B, when a power supply voltage driving the power amplifier is allowed to have a small margin, the voltage is able to become a waveform follow-up power supply voltage that changes in accordance with the envelope signal.

Therefore, although regions of R13 and R14 in FIG. 13B become wasted power regions, these regions are only the regions having margins with respect to the envelope signal. Accordingly, as illustrated in FIG. 13D where a bar chart is formed therewith, it becomes possible to increase power efficiency by reducing wasted power. Note that FIG. 13A to FIG. 13D merely illustrate examples.

Figure 14A:
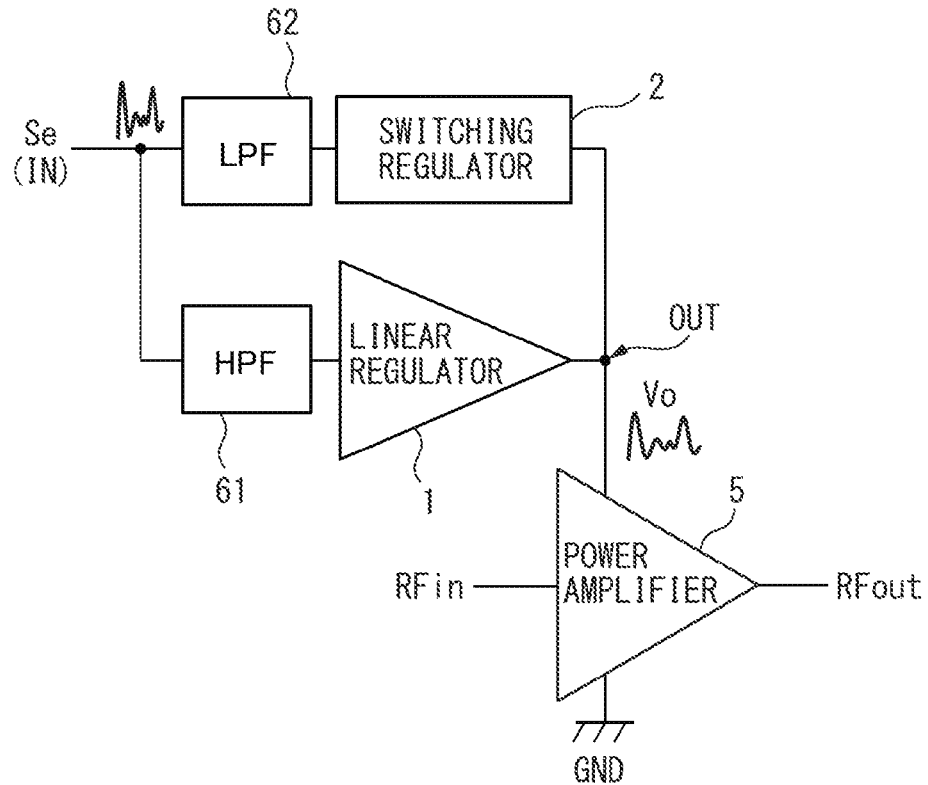
FIG. 14A, FIG. 14B, and FIG. 14C are diagrams for describing one example of a power supply device.
Figure 14B:
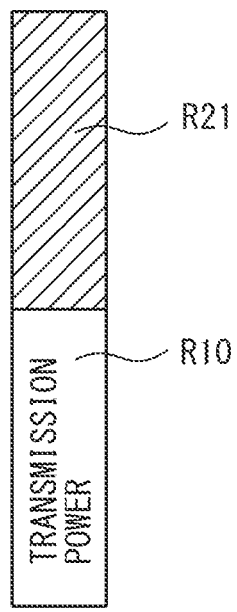
Figure 14C:
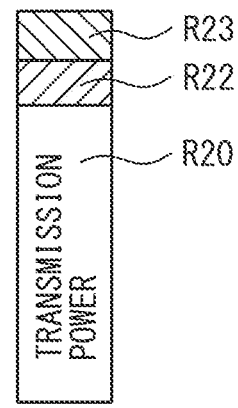

FIG. 14A, FIG. 14B, and FIG. 14C are diagrams for describing one example of a power supply device (high-speed power supply device). FIG. 14A is a block diagram illustrating a system in which a power amplifier 5 is driven by a power supply device of an ET (envelope tracking) system.

As illustrated in FIG. 14A, for example, an envelope signal Se that is an output of an envelope generator (for example, the amplitude detector 101 in FIG. 1) is input to the linear regulator 1 via a high-frequency pass filter (high-pass filter: HPF) 61 and to the switching regulator 2 via a low-frequency pass filter (low-pass filter: LPF) 62.

An output of the linear regulator 1 and an output of the switching regulator 2 are connected together at an output node OUT and an output voltage Vo is generated thereat. The output voltage Vo is used as a power supply voltage of the power amplifier 5 and then the power amplifier 5 outputs a high frequency output signal RFout by amplifying a high frequency input signal RFin.

The linear regulator 1 has poor efficiency but a broad band linear amplifier is capable of supplying power of a high frequency component. On the other hand, the switching regulator 2 has high efficiency and a switching DC/DC converter is capable of supplying power of a low frequency component.

In other words, as illustrated in FIG. 14B, when the power amplifier 5 is driven only by the switching regulator (DC/

DC converter) 2 with no operation of the linear regulator (linear amplifier) 1, it is not possible to follow-up an envelope signal and thereby, for example, power efficiency becomes about 30% due to a region R21 of wasted power.

On the other hand, as illustrated in FIG. 14C, when the power amplifier 5 is driven by both the linear regulator (linear amplifier) 1 and the switching regulator (DC/DC converter) 2, it is possible to follow-up an envelope signal. Therefore, compared to FIG. 14B, regions R22 and R23 of wasted power are markedly reduced and it is possible to increase power efficiency, for example, up to about 50%.

In FIG. 14C, the region R22 corresponds to, for example, the wasted power region R13+R14 for providing a margin with respect to an envelope signal described with reference to FIG. 13D. Further, the region 23 represents a wasted current region (current overhead) due to bias current and the like of the linear amplifier in the linear regulator 1.

Figure 15A:
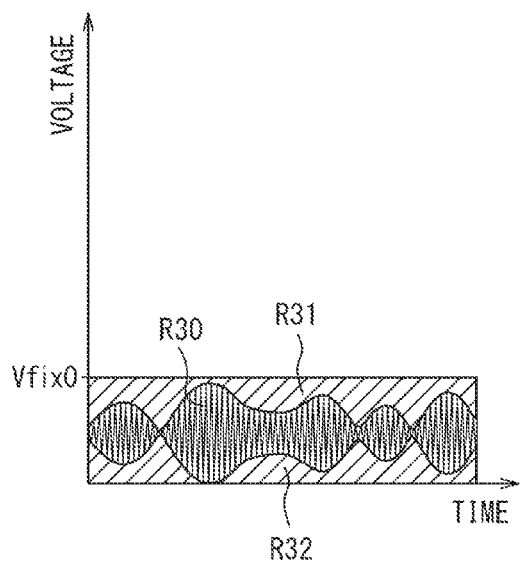
FIG. 15A, FIG. 15B, FIG. 15C, and FIG. 15D are diagrams illustrating, in comparison, power consumptions of a power amplifier according to a fixed power supply voltage and a waveform follow-up power supply voltage at the time of a low output using the power supply device illustrated in FIG. 14A.
Figure 15B:
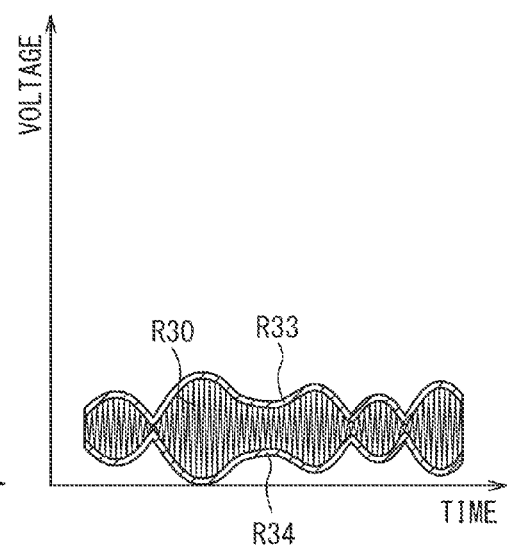
Figure 15C:
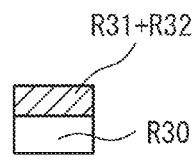
Figure 15D:
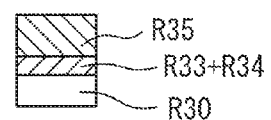

FIG. 15A, FIG. 15B, FIG. 15C, and FIG. 15D are diagrams illustrating, in comparison, power consumption of a power amplifier according to a fixed power supply voltage and a waveform follow-up power supply voltage at the time of a low output using the power supply device illustrated in FIG. 14A. FIG. 15A and FIG. 15C illustrate power consumption of the power amplifier at the time of applying a fixed power supply voltage. FIG. 15B and FIG. 15D illustrate power consumption of the power amplifier at the time of applying a waveform follow-up power supply voltage.

Herein, in FIG. 15A to FIG. 15D, reference sign R30 represents a region of transmission power used as a transmission RF signal and reference signs R31 to R35 represent regions becoming wasted power. Especially, the wasted power region R35 corresponds to the wasted current region R23 due to bias current and the like of the linear amplifier in FIG. 14C.

As illustrated in FIG. 15A, in the case where output power is small, in other words, the power amplifier is driven by applying a fixed power supply voltage of a low voltage Vfix0, a relationship between the region R30 of transmission power and the region R31+R31 of wasted power is established as illustrated in FIG. 15C. Specifically, in the same manner as in aforementioned FIG. 14B, power efficiency is, for example, about 30%.

On the other hand, as illustrated in FIG. 15B, in the case where output power is small, a relationship between the region R30 of transmission power and the region R33+R34+R35 of wasted power is established as illustrated in FIG. 15D and power efficiency becomes less than 30% (for example, about 10%).

The reason, for example, is that the wasted current region R35 due to bias current and the like of the linear amplifier in the linear regulator 1 is constant, regardless of a magnitude of the output power. Therefore, as is apparent from a comparison of FIG. 15C and FIG. 15D, it is understood that, for example, in the case of small output power, it is preferable for the linear regulator 1 to stop and the switching regulator 2 to drive the power amplifier by outputting a fixed power supply voltage therefrom.

Figure 16:
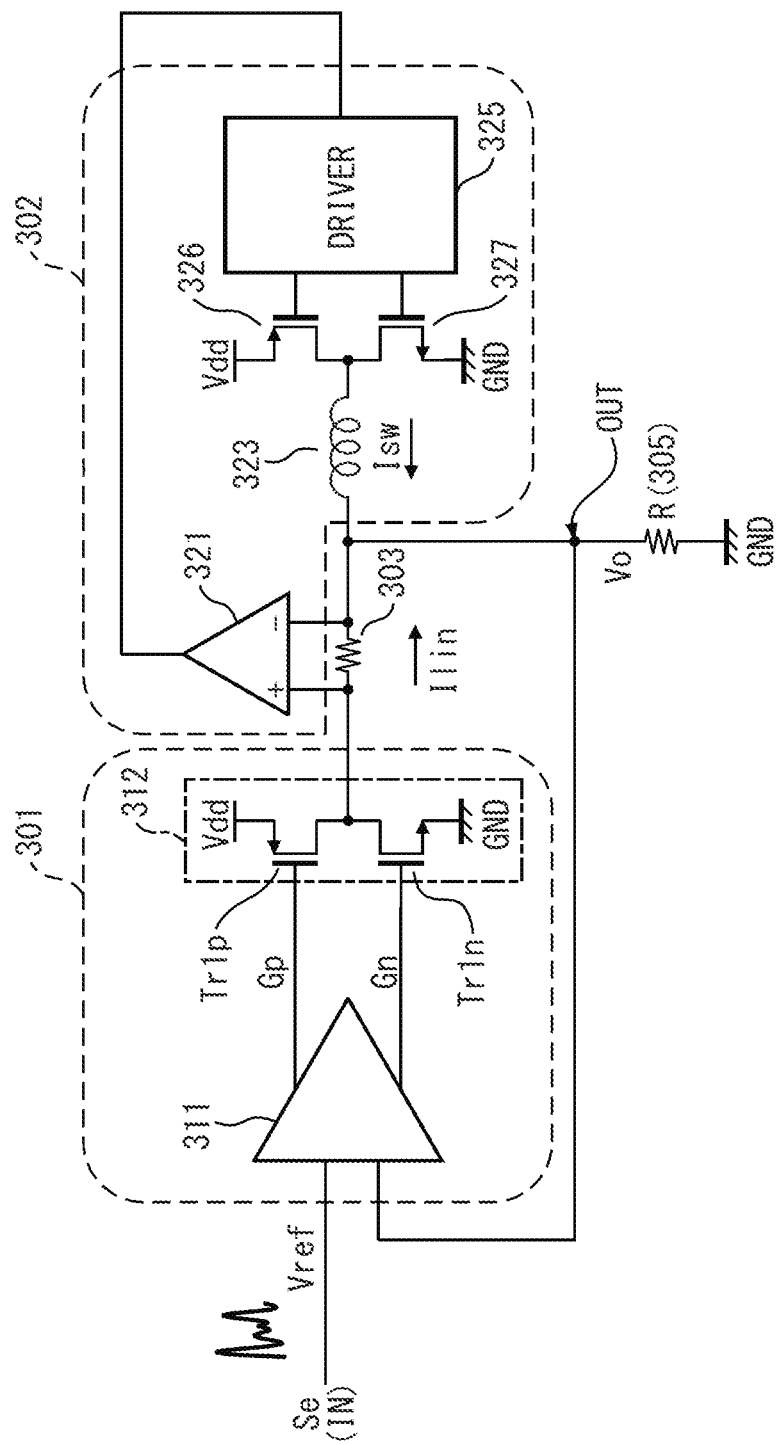
FIG. 16 is a circuit diagram illustrating another example of a hybrid-type power supply device.

FIG. 16 is a circuit diagram illustrating another example of a hybrid-type power supply device and corresponds to the one in the power supply device illustrated in aforementioned FIG. 4, where the linear regulator 301 is represented by a front stage amplifier 311 and an output stage amplifier 312 and the switching regulator 302 is modified. In FIG. 16, the power amplifier 305 of FIG. 4 is represented as a load R of the power amplifier.

In other words, in FIG. 16, the switching regulator 302 includes a hysteresis comparator 321, a coil 323, a driver 325, and transistors (switches) 326 and 327.

In an input of the hysteresis comparator 321, a current detecting resistance 303 is disposed. A direction of an output current Ilin of the linear regulator 301 is detected by the current detecting resistance 303 and the transistors 326 and 327 are controlled via the driver 325.

Here, the transistors Tr1p and Tr1n of the output stage amplifier 312 in the linear regulator 301 correspond to, for example, the transistors Tr1p and Tr1n of the output stage amplifier 12 in aforementioned FIG. 6.

Further, the coil 323, the driver 325, and the transistors 326 and 327 in the switching regulator 302 correspond to, for example, the coil 23, the driver 25, and the transistors 26 and 27, in aforementioned FIG. 6, respectively.

Since only an inductance based on the coil 323 is present between the switches (transistors) 326 and 327 and an output node OUT, the power supply device illustrated in FIG. 16 has a broad band (determined by a through rate of the coil 323), resulting in a possibility of increasing efficiency during waveform follow-up.

The power supply device illustrated in FIG. 16 detects an output current Ilin of the linear regulator 301 by the current detecting resistance 303 in the same manner as the power supply device of aforementioned FIG. 4. Here, a case of applying the present embodiment that has been described with reference to FIG. 5 to FIG. 12 to the power supply device of FIG. 16 will now be discussed.

In this case, when the linear regulator 301 is stopped to reduce wasted power (R35) due to the linear regulator 301, the operation of the switching regulator 2 is also stopped. Accordingly, the power supply device illustrated in FIG. 16 generates no output voltage Vo.

Figure 17:
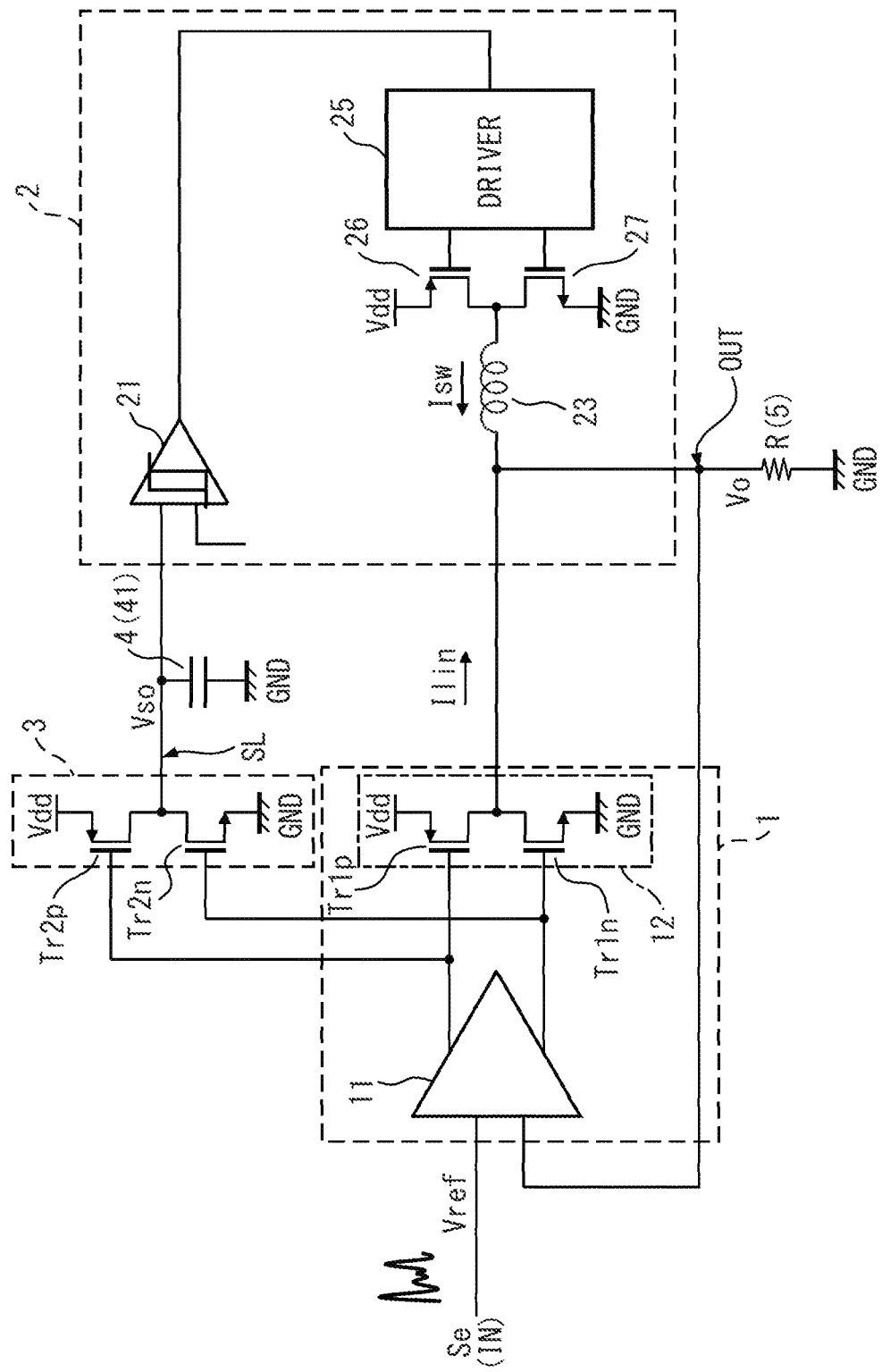
FIG. 17 is a circuit diagram where the first embodiment is applied to the hybrid-type power supply device illustrated in FIG. 16.

FIG. 17 is a circuit diagram where the first embodiment is applied to the hybrid-type power supply device illustrated in FIG. 16. In other words, the power supply device illustrated in FIG. 17 corresponds to the one where, for example, the configuration of aforementioned FIG. 6 is applied to the power supply device of FIG. 16; and the current sensing circuit 3 is provided and the current detecting resistance 303 is removed.

In FIG. 17, the hysteresis buffer 21 of FIG. 6 is represented as a comparator in which an output (Vso) of the current sensing circuit 3 is input to one input of the comparator and a predetermined reference voltage is input to the other input thereof. Further, in a front stage of the switching regulator 2 (hysteresis buffer 21), a delay circuit 4 (the capacitor 41 illustrated in FIG. 10A) is disposed.

As described above, in the power supply device illustrated in FIG. 17, for example, when the linear regulator 1 stops, it becomes difficult for the current sensing circuit 3 to output a signal in accordance with an output current of the linear regulator 1, and thereby, the switching regulator 2 also stops.

As a result, for example, when an output power of the power amplifier is small, the linear regulator 1 stops and thereby, it becomes difficult to drive the power amplifier with a fixed power supply voltage from the switching regulator 2.

Figure 18:
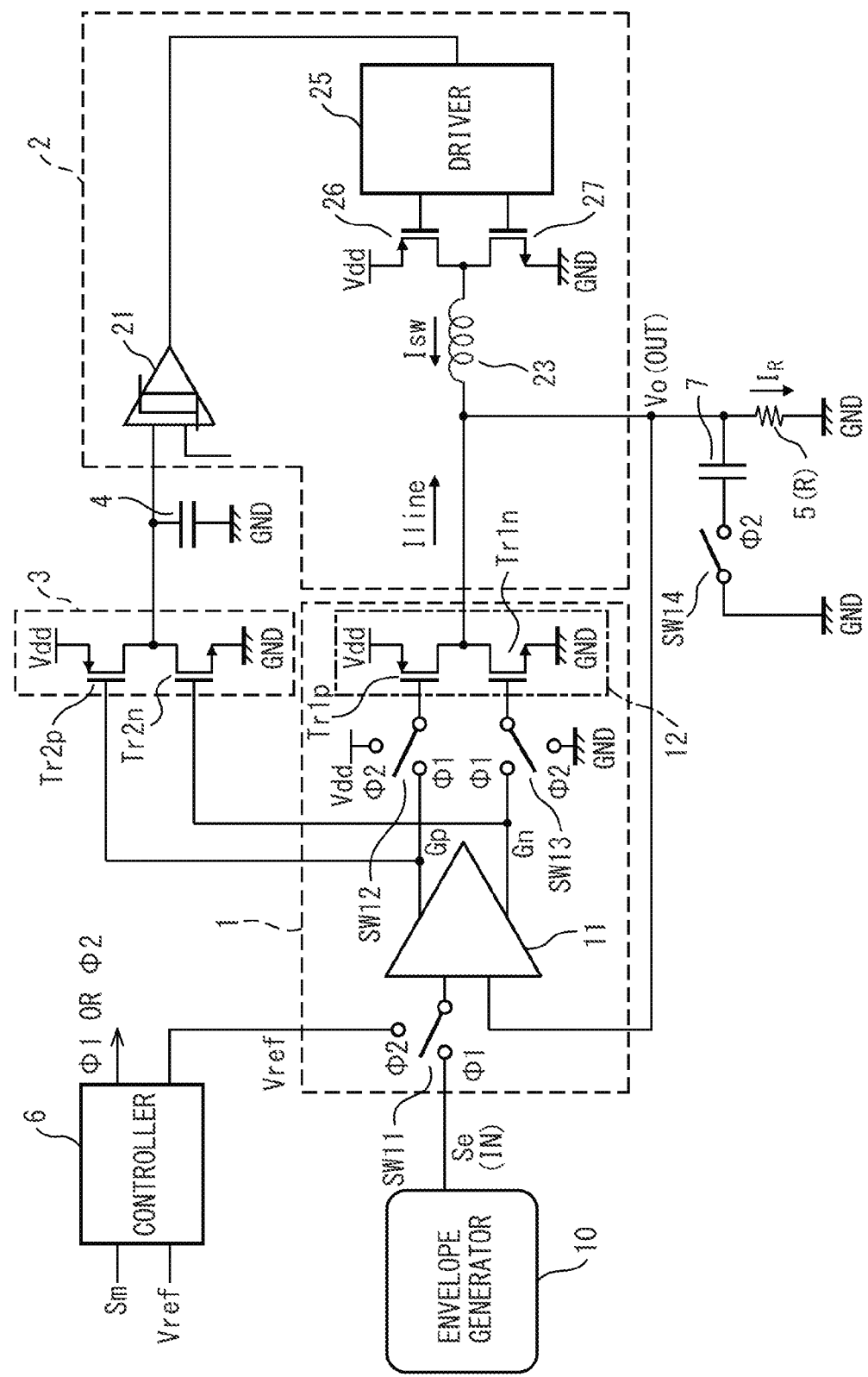
FIG. 18 is a circuit diagram illustrating one example of a power supply device of a fourth embodiment.

FIG. 18 is a circuit diagram illustrating one example of a power supply device of a fourth embodiment, in which the problems of the power supply device of aforementioned FIG. 17 have been solved.

As is apparent from a comparison of FIG. 18 and aforementioned FIG. 17, a controller 6, switches SW11 to SW14, and a smoothing capacitor 7 are added to the power supply device of the fourth embodiment. In the power supply device of FIG. 18, an envelope generator 10 corresponds to, for example, the amplitude detector 101 in FIG. 1.

In one input of the front stage amplifier (comparator) 11, the switch SW11 is disposed, and in accordance with a control signal from the controller 6, an envelope signal Se from the envelope generator 10 or a fixed power supply voltage mode voltage Vref is selectively input to the switch.

At that time, when a fixed power supply voltage is output, a mode selection signal Sm indicating which one of a fixed power supply voltage and a waveform follow-up power supply voltage is to select as the output voltage Vo is input to the controller 6, together with a fixed power supply voltage mode voltage Vref for specifying a level of an output voltage Vo of the power supply device.

In other words, the mode selection signal Sm refers to a signal that determines at which one of the fixed power supply voltage and the waveform follow-up power supply voltage to drive the power amplifier to increase power efficiency in accordance with an output power of the power amplifier and then indicates a fixed power supply voltage mode or a waveform follow-up power supply voltage mode.

Herein, it is possible not to input mode selection signal Sm to the controller 6 from the outside, and instead, for example, the controller 6 is allowed to have an output power serving as a threshold value for switching the fixed power supply voltage mode and the waveform follow-up power supply voltage mode. Then the controller 6 itself may determine to output a selection signal to each of the switches SW11 to SW14.

The other input of the comparator 11 is connected to an output node OUT and an output voltage Vo is input thereto. Herein, the comparator 11 outputs, for example, the control signals Gp and Gn described with reference to FIG. 6.

At the gate of the pMOS transistor Tr1p of the output stage amplifier 12, the switch SW12 is disposed to selectively input a signal Gp from the comparator 11 or a power supply potential (Vdd) in accordance with a control signal from the controller 6.

At the gate of the nMOS transistor Tr1n of the output stage amplifier 12, the switch SW13 is disposed to selectively input a signal Gn from the comparator 11 or a grounding potential (GND) in accordance with a control signal from the controller 6. Further, at the output node OUT, the smoothing capacitor 7 connected to a grounding line GND via the switch SW14 is disposed.

Initially, when a fixed power supply voltage is output, the output stage amplifier (output buffer) 12 which consumes a largest amount of power in the linear regulator 1 is blocked (fixed at high impedance) and the front stage amplifier 11 is used as the comparator to control an output voltage Vo. At that time, to decrease the output ripple and the impedance, the smoothing capacitor 7 is connected to the output node OUT.

In other words, when the fixed power supply voltage is output, each of the switches SW11 to SW 14 is connected to a φ2 side. Thereby, a fixed power supply voltage mode voltage Vref is input to one input of the comparator 11 and a comparison with an output voltage Vo of the other input is performed. Then, the switching regulator 2 is controlled via the current sensing circuit 3 so that the output voltage Vo becomes the Vref.

At that time, since a power supply potential (Vdd) is applied to the gate of the transistor Tr1p of the output buffer 12 and a grounding potential (GND) is applied to the gate of the transistor Tr1n, both transistors are switched off and therefore the output buffer (output stage amplifier) 12 consumes no power. In addition, the smoothing capacitor 7 is connected to the output node OUT between the node and the grounding line GND.

On the other hand, when a waveform follow-up power supply voltage is output, the output buffer 12 of the linear regulator 1 is operated and then the output buffer 12 and the current sensing circuit 3 are used, for example, as the same configuration as in the power supply device illustrated in FIG. 6.

In other words, when the waveform follow-up power supply voltage is output, each of the switches SW11 to SW14 is connected to a φ1 side. Thereby, an envelope signal Se is input to one input of the comparator (front stage amplifier) 11 and a comparison with an output voltage Vo of the other input is performed. Then, the linear regulator 1 is controlled so that the output voltage Vo changes in accordance with the envelope signal Se.

At that time, a control signal Gp from the front stage amplifier 11 is input to the gate of the transistor Tr1p of the output buffer 12, and a control signal Gn from the front stage amplifier 11 is input to the gate of the transistor Tr1n. Herein, the smoothing capacitor 7 at the output node OUT is blocked and therefore high-speed waveform follow-up with respect to the envelope signal Se becomes possible.

In this manner, since the power supply device of the fourth embodiment makes it possible to use the front stage amplifier 11 as a fixed power supply voltage mode comparator, a reduction in occupied area is realized. Further, when a setting is made at a fixed power supply voltage, the smoothing capacitor 7 is connected, and therefore, it is possible to further smooth an output voltage Vo in the fixed power supply voltage mode.

In addition, when a fixed power supply voltage is output, the linear regulator 1 is activated (at an operational state), and therefore, it is possible to instantaneously make a setting at a desired fixed power supply voltage. When the output buffer (output stage amplifier) 12 is set at high impedance at the time of connecting the smoothing capacitor 7 to the output node OUT, the output voltage Vo is caused to be temporarily decreased. However, the output voltage Vo is immediately returned to the fixed power supply voltage according to an operation of the switching regulator 2.

Since the switching regulator 2 includes the delay circuit 4 and the hysteresis buffer 21, current is able to be supplied with no switching operation until a desired fixed power supply voltage is reached. Therefore, it is possible to charge faster compared to a power supply of a fixed frequency.

Figure 19:
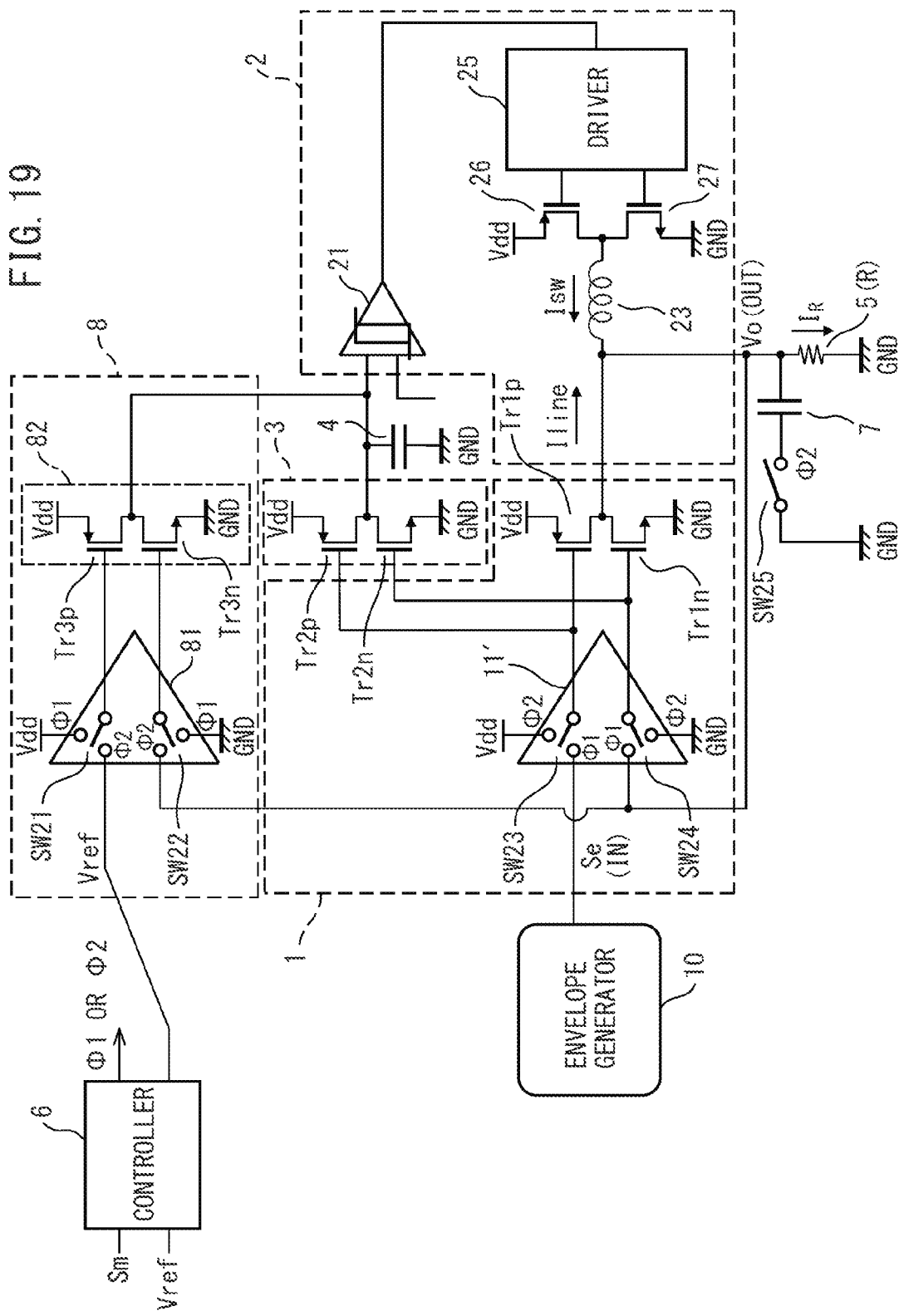
FIG. 19 is a circuit diagram illustrating one example of a power supply device of a fifth embodiment.

FIG. 19 is a circuit diagram illustrating one example of a power supply device of a fifth embodiment. A fixed power supply voltage mode comparator unit 8 is further added so that the switching regulator 2 generates a fixed power supply voltage, even when the linear regulator is stopped. However, switches SW21 to SW25 differ from the switches SW11 to SW14 in FIG. 18.

In other words, in the fourth embodiment illustrated in FIG. 18, the front stage amplifier 11 included in the linear regulator 1 also functions as the fixed power supply voltage mode comparator, however, in the fifth embodiment, a comparator is provided separately from the front stage amplifier 11.

As illustrated in FIG. 19, a fixed power supply voltage mode comparator unit 8 is added to the power supply device of the fifth embodiment. The fixed power supply voltage mode comparator unit 8 includes a fixed power supply voltage mode comparator 81 and a fixed power supply voltage mode current sensing circuit 82 having a configuration corresponding to the current sensing circuit 3.

Herein, a transistor size of the fixed power supply voltage mode comparator 81 is allowed, for example, to be smaller than that of the front stage amplifier 11 since the fixed power supply voltage mode current sensing circuit 82 only needs to operate.

Further, the fixed power supply voltage mode current sensing circuit 82 includes a pMOS transistor Tr3p and an nMOS transistor Tr3n, and operations of these transistors are the same as in the current sensing circuit 3 described above.

As is apparent from a comparison of FIG. 19 and aforementioned FIG. 18, in the power supply device of the fifth embodiment, an envelope signal Se from an envelope generator 10 is directly input to one input of the front stage amplifier 11 without going through a switch (SW11).

Still further, the switches SW12 and SW13 in the above described power supply device of the fourth embodiment becomes also unnecessary, and output signals Gp and Gn of the front stage amplifier 11 are also directly input to the gates of the transistors Tr1p and Tr1n of the output stage amplifier 12.

In FIG. 19, switches SW21 and SW22 of the fixed power supply voltage mode comparator 81 and switches SW23 and SW24 of a front stage amplifier 11' are used to stop and activate respective operations thereof and these switches are originally provided in some cases.

In FIG. 19, for example, when output power is small, the linear regulator 1 is stopped and the power amplifier 5 is driven by a fixed power supply voltage from the switching regulator 2. In this case, each of the switches SW21 to SW25 is switched to the ϕ2 side in accordance with a control signal of the controller 6.

In other words, the fixed power supply voltage mode comparator 81 is activated to be at an operational state. Then, the front stage amplifier 11' is stopped to stop the linear regulator 1 in order not to make wasteful current due to such as bias current of the linear amplifier flow. Further, the smoothing capacitor 7 is connected to an output node OUT.

On the other hand, in the case where the power amplifier 5 is driven at a waveform follow-up power supply voltage, for example, when the amplifier is used as a power supply device of an ET or EER system, each of the switches SW21 to SW25 is switched to the ϕ1 side in accordance with a control signal from the controller 6. In other words, the fixed power supply voltage mode comparator 81 is stopped and the front stage amplifier 11 is activated to operate the linear regulator 1, and further the smoothing capacitor 7 is disconnected from the output node OUT.

Figure 20:
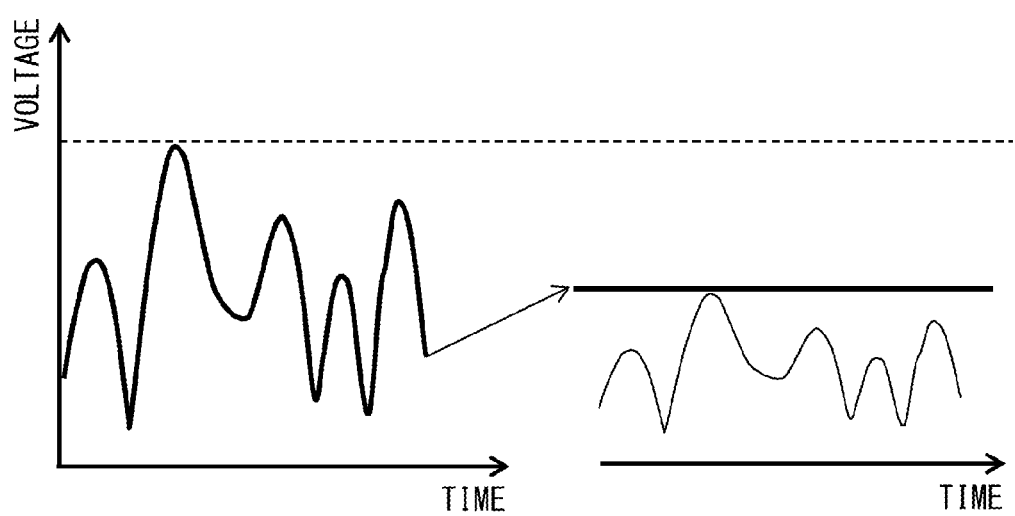
FIG. 20 is a chart for describing a shift from a waveform follow-up power supply voltage mode to a fixed power supply voltage mode in the power supply devices of the fourth and fifth embodiments.

FIG. 20 is a chart for describing a shift from the waveform follow-up power supply voltage mode to the fixed power supply voltage mode in the power supply devices of the fourth and fifth embodiments. Herein, in FIG. 20, the left side indicates an output voltage Vo of the waveform follow-up power supply voltage mode and the right side indicates an output voltage Vo of the fixed power supply voltage mode.

For example, when output power is decreased and driving of the power amplifier 5 at a fixed power supply voltage realizes higher power efficiency, the respective switches SW11 to SW14 and the respective switches SW21 to SW25 are switched from the ϕ1 side to the ϕ2 side. Thereby, it is possible to switch immediately to the fixed power supply voltage mode.

In the above-discussed description, it will be understood without saying that the configurations of FIG. 18 and FIG. 19 are merely examples and the configurations of the switches, connection points, and the like are able to be variously modified. In this manner, the fourth and fifth embodiments make it possible to avoid power consumption resulting from a current detecting resistance (303) and also to efficiently drive a power amplifier by switching a fixed power supply voltage and a waveform follow-up power supply voltage.

In the above description, an example has been described in which a power amplifier is the load of the power supply device. However, the power supply device of the present embodiment is applicable without being limited thereto. Further, it will be understood without saying that the power supply device and loads of the power amplifier and the like of the present embodiment are able to be formed as a single semiconductor integrated circuit device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A power supply device comprising:
a linear regulator configured to include an output stage amplifier;
a current sensing circuit configured to detect an output current of the linear regulator, the current sensing circuit being disposed in parallel with the output stage amplifier, in a configuration corresponding to the output stage amplifier; and
a switching regulator configured to operate in accordance with an output signal of the current sensing circuit, wherein,
and
the linear regulator and the switching regulator operate in collaboration with each other to generate an output voltage at an output node,
the linear regulator outputs a waveform follow-up power supply voltage that varies by following a waveform of an envelope signal to be input and a fixed power supply voltage, and
a controller configured to control a waveform follow-up power supply voltage mode for shifting an output voltage of the power supply device to the waveform follow-up power supply voltage and a fixed power supply voltage mode for shifting an output voltage of the power supply device to the fixed power supply voltage by switching the modes, wherein
the linear regulator comprises a front stage amplifier configured to control the output stage amplifier, the front stage amplifier receiving an output voltage signal indicating a level of the output voltage, and
at the time of the waveform follow-up power supply voltage mode, the controller causes the front stage amplifier to compare the output voltage signal and the envelope signal by inputting the envelope signal and causes the current sensing circuit and the output stage amplifier to operate, and
at the time of the fixed power supply voltage mode, the controller causes the front stage amplifier to compare the output voltage signal and a predetermined reference voltage by inputting the predetermined reference voltage, causes the current sensing circuit to operate and causes the output stage amplifier to stop.

2. The power supply device according to claim 1, wherein the output stage amplifier comprises a first transistor configured to generate source current and a second transistor configured to generate sink current;
the current sensing circuit comprises a third transistor configured to generate source current and a fourth transistor configured to generate sink current; and
a first control signal for the first transistor controls the third transistor, and a second control signal for the second transistor controls the fourth transistor.

3. The power supply device according to claim 2, wherein a first current generating ability ratio between the first and second transistors is substantially equal to a second current generating ability ratio between the third and fourth transistors.

4. The power supply device according to claim 2, wherein sizes of the first and second transistors are larger than sizes of the third and fourth transistors.

5. The power supply device according to claim 2, wherein the switching regulator comprises:
    a switching device that is switch-controlled in accordance with an output signal of the current sensing circuit; and
    a coil that is disposed between the switching device and the output node.

6. The power supply device according to claim 5, wherein the switching regulator further comprises a hysteresis buffer configured to receive an output signal of the current sensing circuit, and
    the switching device is switch-controlled in accordance with an output signal of the hysteresis buffer.

7. The power supply device according to claim 6, wherein the hysteresis buffer comprises variable hysteresis characteristics.

8. The power supply device according to claim 7, wherein the hysteresis buffer comprises a variable resistance connected between an input and an output of the hysteresis buffer.

9. The power supply device according to claim 5, wherein the switching device comprises a fifth transistor connected in series to a diode,
    a common connection node of the diode and the fifth transistor is connected to a first terminal of the coil,
    a common connection node of the first and second transistors is connected to a second terminal of the coil, and
    the common connection node of the first and second transistors is connected to the output node.

10. The power supply device according to claim 5, wherein
    the switching regulator further comprises a driver configured to drive sixth and seventh transistors that are the switching devices,
    a common connection node of the sixth and seventh transistors is connected to the output node via the coil, and
    a common connection node of the first and second transistors is connected to the output node.

11. The power supply device according to claim 1, the power supply device further comprising:
    a delay circuit disposed in an output stage of the current sensing circuit.

12. The power supply device according to claim 11, wherein
    a delay time of the delay circuit is variable in accordance with an external control signal.

13. The power supply device according to claim 11, wherein
    the delay circuit comprises a variable or fixed capacitor.

14. The power supply device according to claim 11, wherein
    the delay circuit comprises a low-pass filter including a variable or fixed capacitor and a variable or fixed resistance.

15. The power supply device according claim 1, the power supply device further comprising:
    a hysteresis buffer disposed in a front stage of the switching regulator, and hysteresis characteristics of the hysteresis buffer is variable in accordance with an external signal.

16. The power supply device according to claim 1, wherein
    the fixed power supply voltage is specified in accordance with a maximum level of the envelope signal to be input.

17. A power supply device comprising:
    a linear regulator configured to include an output stage amplifier;
    a current sensing circuit configured to detect an output current of the linear regulator, the current sensing circuit being disposed in parallel with the output stage amplifier, in a configuration corresponding to the output stage amplifier; and
    a switching regulator configured to operate in accordance with an output signal of the current sensing circuit, wherein
    the linear regulator and the switching regulator operate in collaboration with each other to generate an output voltage at an output node,
    the linear regulator outputs a waveform follow-up power supply voltage that varies by following a waveform of an envelope signal to be input and a fixed power supply voltage by switching, and
    a controller configured to control a waveform follow-up power supply voltage mode for shifting an output voltage of the power supply device to the waveform follow-up power supply voltage and a fixed power supply voltage mode for shifting an output voltage of the power supply device to the fixed power supply voltage by switching the modes, wherein
    the linear regulator comprises:
        a front stage amplifier configured to control the output stage amplifier, the front stage amplifier receiving the output voltage signal indicating a level of the envelope signal and the output voltage;
        a fixed power supply voltage mode comparator configured to receive an output voltage signal indicating a level of a predetermined reference voltage from the controller and the output voltage; and
        a fixed power supply voltage mode current sensing circuit controlled by an output signal of the fixed power supply voltage mode comparator, and having a configuration corresponding to the current sensing circuit, wherein
        at the time of the waveform follow-up power supply voltage mode, the controller stops the fixed power supply voltage mode current sensing circuit and operates the front stage amplifier, and
        at the time of the fixed power supply voltage mode, the controller stops the front stage amplifier and operates the fixed power supply voltage mode current sensing circuit.

18. A semiconductor integrated circuit device comprising:
a power supply device; and
a power amplifier for receiving an output voltage generated in the power supply device as a power supply voltage and then amplifying an input high frequency signal to output amplified signal, wherein
the power supply device comprising:
a linear regulator configured to include an output stage amplifier;
a current sensing circuit configured to detect an output current of the linear regulator, the current sensing circuit being disposed in parallel with the output stage amplifier, in a configuration corresponding to the output stage amplifier; and
a switching regulator configured to operate in accordance with an output signal of the current sensing circuit, wherein
the linear regulator and the switching regulator operate in collaboration with each other to generate an output voltage at an output node,
the linear regulator outputs a waveform follow-up power supply voltage that varies by following a waveform of an envelope signal to be input and a fixed power supply voltage, and
a controller configured to control a waveform follow-up power supply voltage mode for shifting an output voltage of the power supply device to the waveform follow-up power supply voltage and a fixed power supply voltage mode for shifting an output voltage of the power supply device to the fixed power supply voltage by switching the modes, wherein
the linear regulator comprises a front stage amplifier configured to control the output stage amplifier, the front stage amplifier receiving an output voltage signal indicating a level of the output voltage, and
at the time of the waveform follow-up power supply voltage mode, the controller causes the front stage amplifier to compare the output voltage signal and the envelope signal by inputting the envelope signal and causes the current sensing circuit and the output stage amplifier to operate, and
at the time of the fixed power supply voltage mode, the controller causes the front stage amplifier to compare the output voltage signal and a predetermined reference voltage by inputting the predetermined reference voltage, causes the current sensing circuit to operate and causes the output stage amplifier to stop.

19. The semiconductor integrated circuit device according to claim 18, the semiconductor integrated circuit device further comprising:
an amplitude detector configured to receive the high frequency signal and detect envelope of the high frequency signal to output an envelope signal to the power supply device.

20. The semiconductor integrated circuit device according to claim 18, the semiconductor integrated circuit device further comprising:
a limiter configured to receive the high frequency signal and then output, to the power amplifier, a high frequency phase signal indicating a frequency component of the high frequency signal.

21. A semiconductor integrated circuit device comprising:
a power supply device; and
a power amplifier for receiving an output voltage generated in the power supply device as a power supply voltage and then amplifying an input high frequency signal to output amplified signal, wherein
the power supply device comprising:
a linear regulator configured to include an output stage amplifier;
a current sensing circuit configured to detect an output current of the linear regulator, the current sensing circuit being disposed in parallel with the output stage amplifier, in a configuration corresponding to the output stage amplifier; and
a switching regulator configured to operate in accordance with an output signal of the current sensing circuit, wherein
the linear regulator and the switching regulator operate in collaboration with each other to generate an output voltage at an output node,
the linear regulator outputs a waveform follow-up power supply voltage that varies by following a waveform of an envelope signal to be input and a fixed power supply voltage by switching,
a controller configured to control a waveform follow-up power supply voltage mode for shifting an output voltage of the power supply device to the waveform follow-up power supply voltage and a fixed power supply voltage mode for shifting an output voltage of the power supply device to the fixed power supply voltage by switching the modes,
wherein
the linear regulator comprises:
a front stage amplifier configured to control the output stage amplifier, the front stage amplifier receiving the output voltage signal indicating a level of the envelope signal and the output voltage;
a fixed power supply voltage mode comparator configured to receive an output voltage signal indicating a level of a predetermined reference voltage from the controller and the output voltage; and
a fixed power supply voltage mode current sensing circuit controlled by an output signal of the fixed power supply voltage mode comparator, and having a configuration corresponding to the current sensing circuit, wherein
at the time of the waveform follow-up power supply voltage mode, the controller stops the fixed power supply voltage mode current sensing circuit and operates the front stage amplifier, and
at the time of the fixed power supply voltage mode, the controller stops the front stage amplifier and operates the fixed power supply voltage mode current sensing circuit.

* * * * *